United States Patent [19]
Ishikawa

[11] Patent Number: 6,036,031
[45] Date of Patent: Mar. 14, 2000

[54] SUBSTRATE CASSETTE AND SIDE RAIL THEREFOR

[76] Inventor: Toshio Ishikawa, 1-14-13, Minami, Fukiage-machi, Kitaadachi-gun, Saitama, Japan

[21] Appl. No.: 09/038,339

[22] Filed: Mar. 11, 1998

Related U.S. Application Data

[63] Continuation of application No. 08/435,723, May 5, 1995, abandoned.

[51] Int. Cl.[7] .................................................. A47G 19/08
[52] U.S. Cl. ........................ 211/41.18; 118/500; 206/454
[58] Field of Search ............................. 211/41.18, 41.17, 211/41.1, 41.12, 41.2, 41.3, 41.4, 41.5, 41.6, 41.7, 41.8, 41.9, 41.11, 41.13, 41.14, 41.15, 41.16; 118/500; 206/454; 220/549

[56] References Cited

U.S. PATENT DOCUMENTS 5,042,671  8/1991  Bischoff et al. .

*Primary Examiner*—Blair M. Johnson
*Attorney, Agent, or Firm*—Price, Gess & Ubell

[57] ABSTRACT

A side rail for closing each of side walls of a substrate cassette of a rectangular configuration is disclosed which is capable of preventing deformation of the side rail and a dimensional error thereof. The side rail includes a partition plate formed on a surface thereof with ribs for receiving a plurality of substrates therein in a manner to space them from each other. The ribs are arranged so as to define partition grooves therebetween. The side rails also includes a cover member arranged for covering the partition plate and including rib covers for covering the ribs and groove covers arranged between the rib covers for covering the partition grooves. Also, a substrate cassette having the side rails incorporated therein is disclosed.

37 Claims, 35 Drawing Sheets

F I G. 8
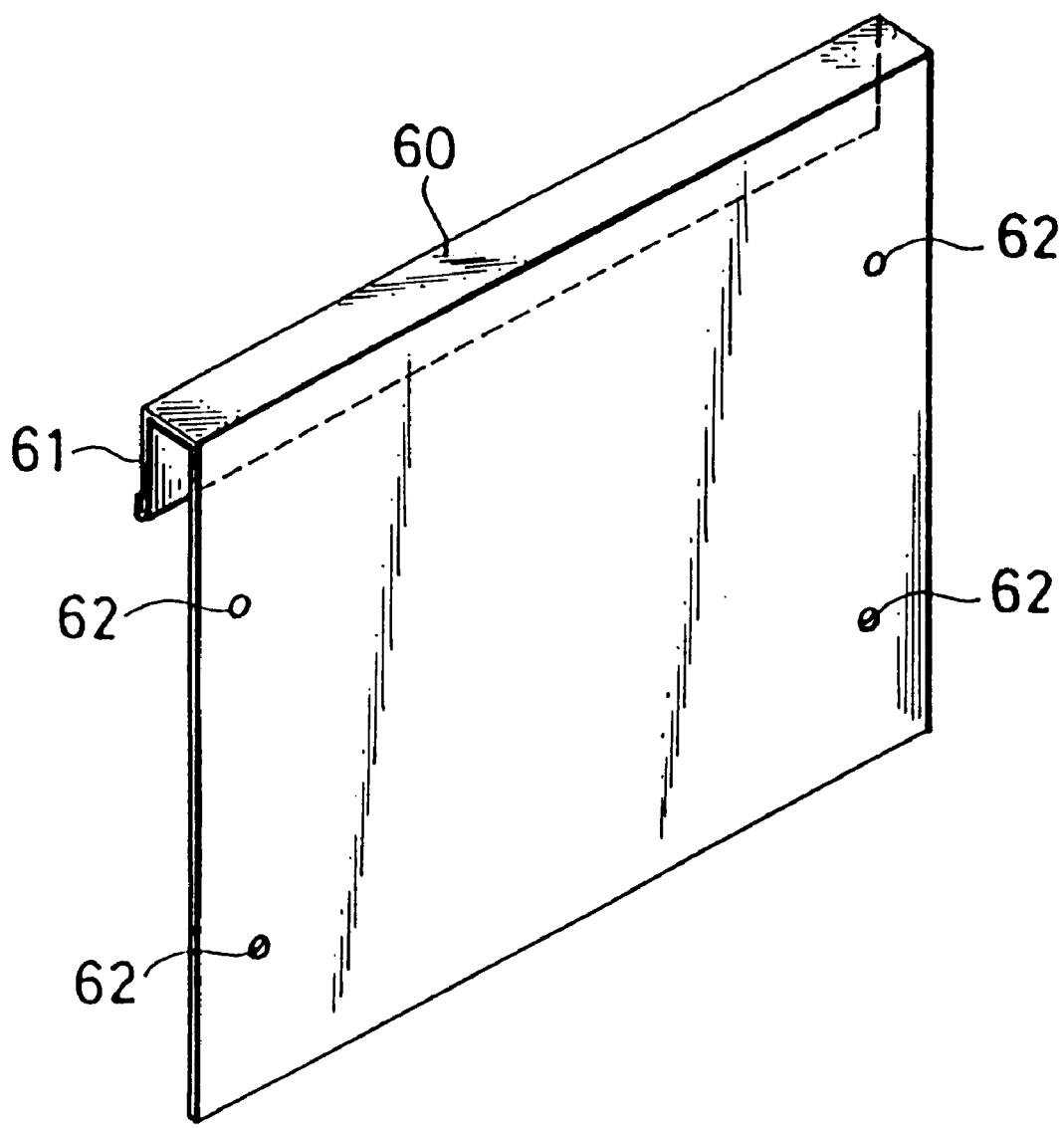

F I G. 10
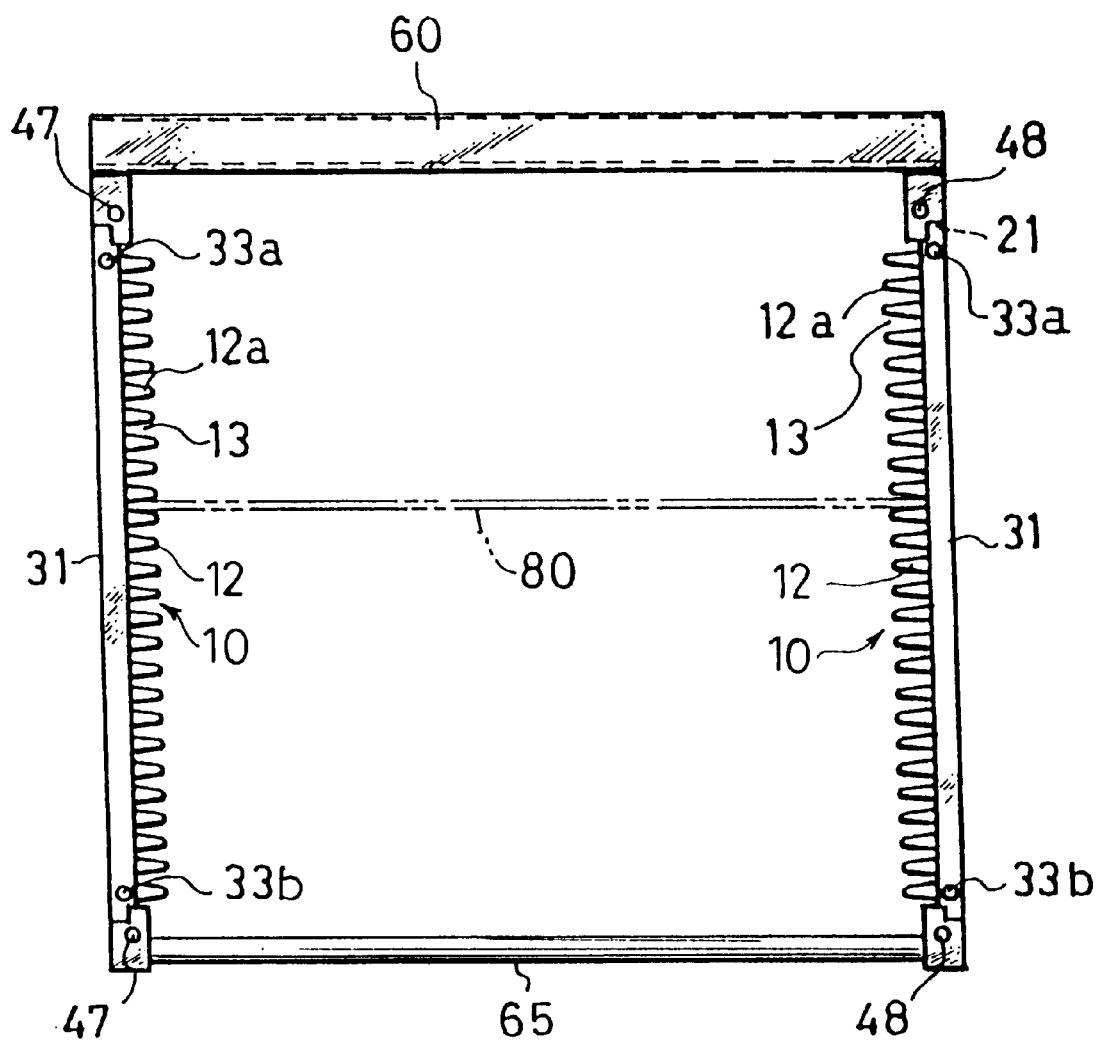

F I G. 35 (A)
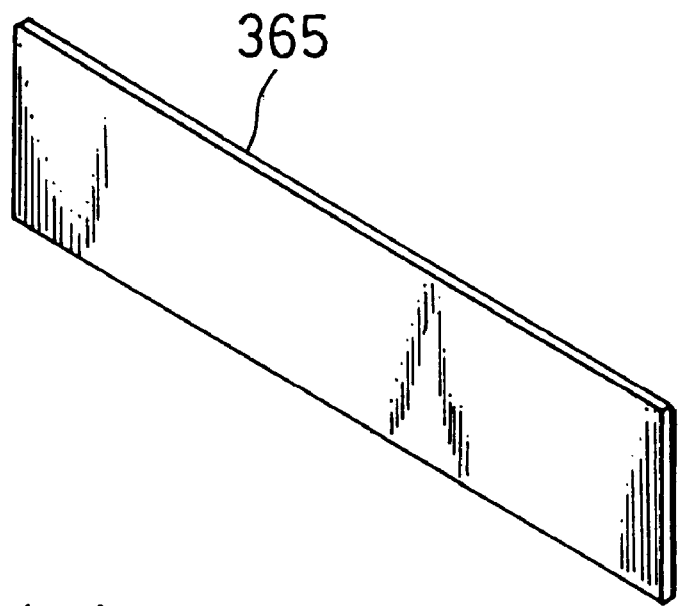
F I G. 35 (B)
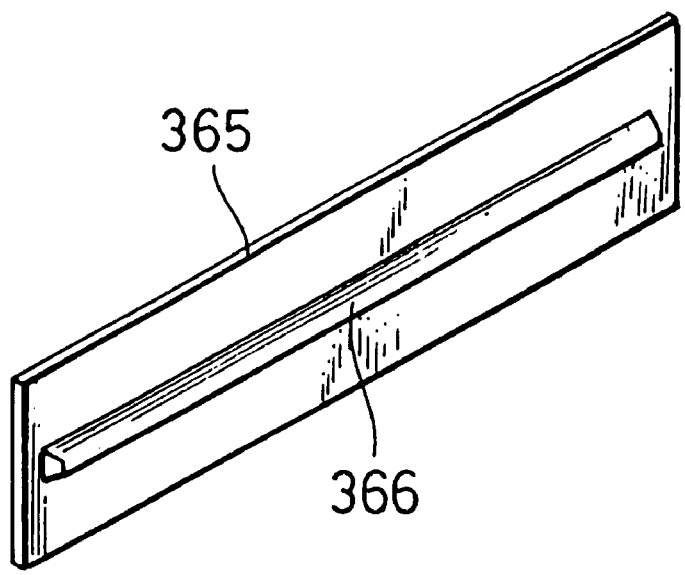

SUBSTRATE CASSETTE AND SIDE RAIL THEREFOR

This is a continuation application of Ser. No. 08/435,723 filed on May 5, 1995, now abandoned.

BACKGROUND OF THE INVENTION

This invention relates to a cassette for substrates (hereinafter referred to as "substrate cassette") which is adapted to receive substrates such as semiconductor wafers, magnetic discs, glass substrates for a liquid crystal display or the like therein and a side rail for the substrate cassette, and more particularly to a substrate cassette of which a section contacted with substrates is replaceable and a side rail therefor.

Processing of substrates such as silicon wafers by way of example generally includes wet steps in which washing of the substrates by means of various liquid chemicals, peeling of a thin film, removal of a sensitizer and the like are carried out and dry steps in which formation of thin films, formation of a pattern, application of a sensitizer and the like are carried out.

A substrate cassette is generally called a wafer basket or a wafer carrier and includes a cassette for the wet steps which is made of a fluoroplastic material such as tetrafluoroechylene-perfluoroalkylvinylether copolymer (PFA) or the like and a cassette for the dry steps which is made of a resin material such as polypropylene or the like.

In order to subject substrates to a heat treatment in a lump while receiving them in a substrate cassette or receive glass substrates for liquid crystal display in a substrate cassette, it is proposed that a substrate cassette is made by providing two side rails or side walls by machining of a metal or plastic plate or injection molding of a resin material, connecting the side rails to each other using a connection means such as an end wall and a fixing rod while keeping the side rails arranged opposite to each other as disclosed in Japanese Utility Model Application Laid-Open Publication No. 193081/1986. Also, a substrate cassette which is integrally formed of a resin material by injection molding is proposed as disclosed in U.S. Pat. No. 3,923,156.

The substrate cassettes proposed each are generally constructed so that side rails or side walls arranged opposite to each other are securely connected to each other using a fixing rod acting as a connection means. The substrate cassette thus constructed is set in an equipment for various wet steps so that access of substrates to the cassette may be carried out while keeping the substrates horizontal.

In order to accommodate the substrate cassette to the equipment, main dimensions of the cassette are defined by SEMI-STANDARD commonly applied. The SEMI-STANDARD is mainly for the purpose of accommodating the substrate cassette to an equipment for the dry steps. The substrate cassette commonly used is designed and manufactured so as to be applied to both dry and wet steps. The fact that the conventional substrate cassette is directed to both dry and wet steps rather than only the dry steps causes it to exhibit disadvantages or problems.

More particularly, when the conventional substrate cassette is integrally made of resin by injection molding as a whole, deformation of the cassette and an dimensional error thereof are apt to occur due to unstableness in configuration of the cassette by shrinkage of the resin. This causes positional accuracy of the substrate cassette to be deteriorated when it is set in an equipment and substrates received in the cassette to be deteriorated in levelness and interval accuracy, leading to a failure in smooth access of the substrates to the cassette by means of a fork or the like. Such a disadvantage is amplified with an increase in dimension and configuration of the substrate cassette made of resin by injection molding, because an increase in size of the substrates leads to an increase in dimension of the cassette in which the substrates are received. Also, when the substrate cassette in which the substrates of an increased size have been received is set in an equipment so as to horizontally orientate the substrates, elasticity of the resin causes load applied to a lower portion of the cassette to be varied depending on the number of substrates received in the cassette because a whole weight of the substrates is varied depending on the number of substrates received, resulting in a distance between a bottom of the cassette and the substrates being varied to cause the equipment to be encountered with troubles.

In order to avoid the problem, it is proposed that metal such as aluminum or the like is used for the side rail constituting a part of the side wall of the substrate cassette. However, such an approach is subject to restriction because production of fine metal powders due to contact between the metal and the substrates cause pollution of the substrates, resulting in electronic elements mounted on the substrates being adversely affected. Also, it is proposed to coat the side wall of the cassette with resin such as fluoroplastic resin. Unfortunately, fine peeling of the resin occurs on the side wall with time and any impurity and volatile substance contained in the coating solution adversely affect the substrates.

When the whole side rail of the cassette is made of resin, organic ingredients contained in the resin produce a large amount of outer gas. Thus, for example, in the case of a silicon wafer having LSI formed on a surface thereof, this causes the surface of the silicon wafer to be changed from a hydrophilic nature to a hydrophobic nature and an oxide film formed on the surface of the silicone wafer to be adversely affected to a degree sufficient to deteriorate insulating characteristics of the wafer. In order to avoid the problem, it is proposed to set the substrate cassette under a reduced pressure for access of the substrates to the cassette. Unfortunately, this causes the amount of outer gas produced to be disadvantageously increased, to thereby adversely affect the substrates.

Furthermore, when the whole side rail is made of resin, static electricity charged on the side rail is increased, so that a thin film formed on each of the substrates is damaged due to discharge of the static electricity from the side rail, to thereby cause the substrate to adsorb fine particles suspended. In order to reduce the charge, it is often carried out to add an antistatic agent such as a surfactant or the like or a conductive material such as a carbon powder, a carbon fiber, ceramics or the like to the resin. Unfortunately, addition of the surfactant causes a volatile component contained therein to adhere to the substrates and addition of the conductive material causes a metal impurity contained therein to adversely affect the substrates.

In general, fine powders called particles cause disconnection of a circuit formed on the substrate or damages a thin film formed on a surface of the substrate, to thereby reduce yields of products. The number of particles per unit volume is increased with a decrease in particle diameter and the amount of particles produced due to contact between the resin and the substrate is increased with frequency in use of the cassette. In order to eliminate the problem, it would be considered to use resin containing a minimum amount of impurity and exhibiting satisfactory wearing properties and replace the cassette in a short period of time. However, resin of such properties is generally increased in cost. Also, the resin causes injection molding to be substantially hard. In particular, it fails to provide a product complicated in configuration such as the substrate cassette with increased dimensional accuracy and stability in configuration.

SUMMARY OF THE INVENTION

The present invention has been made in view of the foregoing disadvantages of the prior art.

Accordingly, it is an object of the present invention to provide a side rail for a substrate cassette which is capable of permitting deformation of the side rail and dimensional error thereof to be eliminated.

It is another object of the present invention to provide a side rail for a substrate cassette which is capable of permitting selection of a material therefor which minimizes production of particles due to the contact with substrates and prevents contamination of substrates by heavy metal.

It is still another object of the present invention to provide a side rail for a substrate cassette which is capable of minimizing generation of outer gas to substantially prevent the outer gas from adversely affecting substrates.

It is yet another object of the present invention to provide a side wall for a substrate cassette which is capable of minimizing charging of static electricity thereon to substantially prevent the electricity from adversely affecting peripheral equipments.

It is even another object of the present invention to provide a side wall for a substrate cassette which is capable of minimizing production of fine resin powders due to friction between resin and substrates and being decreased in manufacturing cost.

It is a further object of the present invention to provide a substrate cassette which is capable of permitting deformation of the cassette and dimensional error thereof to be eliminated.

It is a yet further object of the present invention to provide a substrate cassette which is capable of permitting selection of a material therefor which minimizes production of particles due to the contact with substrates and prevents contamination of substrates by heavy metal.

It is a yet further object of the present invention to provide a substrate cassette which is capable of minimizing generation of outer gas to substantially prevent the outer gas from adversely affecting substrates.

It is an even further object of the present invention to provide a substrate cassette which is capable of minimizing charging of static electricity thereon to substantially prevent the electricity from adversely affecting peripheral equipments.

It is another object of the present invention to provide a substrate cassette which is capable of minimizing production of fine resin powders due to friction between resin and substrates and being decreased in manufacturing cost.

In accordance with one aspect of the present invention, a side rail for closing each of side walls of a substrate cassette of a rectangular configuration is provided. The side rail includes a partition plate formed on a surface thereof with ribs for receiving a plurality of substrates therein in a manner to space them from each other. The ribs are arranged so as to define partition grooves therebetween. The side rail also includes a cover member arranged for covering the partition plate and including rib covers for covering the ribs and groove covers arranged between the rib covers for covering the partition grooves.

In accordance with this aspect of the present invention, a side rail for a substrate cassette which includes side walls arranged opposite to each other and each including a window adapted to be closed by the side rail and a connection means for connecting the side walls to each other is provided. The side rail includes a partition plate formed on a surface thereof with ribs for receiving a plurality of substrates therein in a manner to space them from each other. The ribs are arranged so as to define partition grooves therebetween. The side rail also includes a cover member arranged for covering the partition plate and including rib covers for covering the ribs and groove covers arranged between the rib covers for covering the partition grooves. The rib covers and groove covers are integrally formed of a resin material and the partition plate and cover member cooperate with each other to constitute a cover unit.

In a preferred embodiment of the present invention, the partition plate and cover member are detachably connected to each other.

In a preferred embodiment of the present invention, the partition plate and cover member are integrally formed of a resin material.

In accordance with this aspect of the present invention, there is also provided a side rail mounted on an inner surface of a substrate cassette which includes side walls each including ribs for receiving a plurality of substrates therein in a manner to space them from each other and partition grooves defined between the ribs. The side rail includes rib covers arranged so as to cover the ribs and groove covers arranged between the rib covers so as to cover the partition grooves. The rib covers and groove covers cooperate with each other to constitute a cover unit.

Further, in accordance with this aspect of the present invention, there is provided a side rail for a substrate cassette including side walls arranged opposite to each other, a connection means for connecting the side walls to each other, ribs formed on each of the side walls for receiving a plurality of substrates therein in a manner to space them from each other and partition grooves defined between the ribs, and formed into a rectangular configuration by cooperation of the side walls and connection means. The side rail includes rib covers for covering the ribs and groove covers defined between the rib covers so as to cover the partition grooves. The rib covers and groove covers are integrally formed of a resin material. The side rail is mounted on each of the side walls to constitute a cover unit forming an inner surface of the substrate cassette.

In addition, in accordance with this aspect of the present invention, a side rail for closing each of side walls of a substrate cassette formed into a rectangular configuration is provided. The side rail includes a flat plate section provided on a surface thereof with ribs for receiving a plurality of substrates therein in a manner to space them from each other. The ribs are arranged so as to define partition grooves therebetween. Also, the ribs are formed on the surface of the flat plate section so as to project therefrom and the partition grooves are arranged so as to be contiguous to the ribs.

In accordance with this aspect of the present invention, there is also provided a side rail for a substrate cassette including side walls arranged opposite to each other and each including a window and a connection means for connecting the side walls to each other and formed into a rectangular configuration by cooperation of the side walls and connection means. The side rail is arranged for closing the window and includes a flat plate section provided on a surface thereof with ribs for receiving a plurality of substrates therein in a manner to space them from each other. The ribs are arranged so as to define partition grooves therebetween. The ribs are formed on the surface of the flat plate section so as to project therefrom and the partition grooves are arranged so as to be contiguous to the ribs. The flat plate section is formed on both sides thereof with lugs guided by guides formed at the window.

In a preferred embodiment of the present invention, the lugs are each formed with mounting holes through which mounting screws are inserted and recesses each communicating with each of the mounting holes and receiving an O-ring therein, as well as steps in a manner to surround the mounting holes.

In accordance with another aspect of the present invention, a substrate cassette is provided. The substrate cassette includes side walls arranged opposite to each other and each including a window, a connection means for connecting the side walls to each other, and a side rail for closing the window of each of the side walls. The side rail includes a partition plate formed on a surface thereof with ribs for receiving a plurality of substrates therein in a manner to space them from each other. The ribs are arranged so as to define partition grooves therebetween. The side rail also includes a cover member arranged for covering the partition plate and including rib covers for covering the ribs and groove covers arranged between the rib covers for covering the partition grooves.

Also, in accordance with this aspect of the present invention, a substrate cassette is provided. The substrate cassette includes side walls arranged opposite to each other and each including a window, a connection means for connecting the side walls to each other, and a side rail for closing the window of each of the side walls. The side walls each include a frame including the window in which the side rail is mounted. The frame is formed on portions of an inside thereof positioned on both sides of the window with vertically extending guides for guiding mounting of the side rail in the window. The side rail includes a flat plate section provided on a surface thereof with ribs for receiving a plurality of substrates therein in a manner to space them from each other. The ribs are arranged so as to define partition grooves therebetween and formed on the surface of the flat plate section so as to project therefrom and the partition grooves are arranged so as to be contiguous to the ribs. The flat plate section is provided on both sides thereof with lugs guided by guides formed at the frame.

In a preferred embodiment of the present invention, the guides each are formed with a closed-end threaded hole for mounting the side rail.

BRIEF DESCRIPTION OF THE DRAWINGS

These and other objects and may of the attendant advantages of the present invention will be readily appreciated as the same becomes better understood by reference to the following detailed description when considered in connection with the accompanying drawings; wherein:

FIG. 8 is a perspective view showing an end wall of the substrate cassette shown in FIG. 2;

FIG. 10 is a plan view of the substrate cassette shown in FIG. 2;

FIGS. 35(A) and 35(B) each are a perspective view showing a fixing plate of the substrate cassette shown in FIG. 28.

DETAILED DESCRIPTION OF THE PREFERRED EMBODIMENTS

Figure 1:
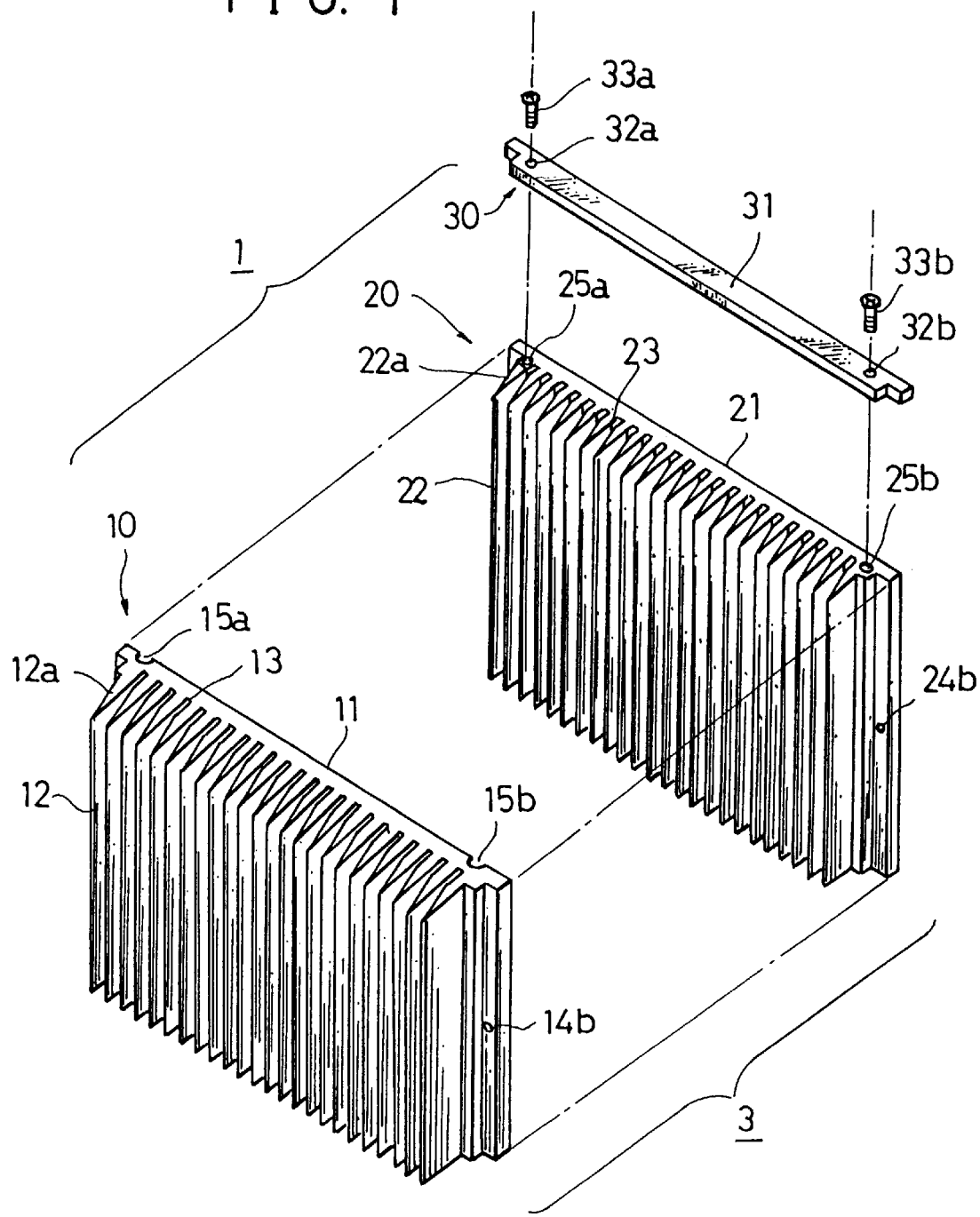
FIG. 1 is an exploded perspective view showing an embodiment of a side rail for a substrate cassette according to the present invention.

Now, the present invention will be described hereinafter with reference to the accompanying drawings.

Referring first to FIGS. 1 and 11 to 14, an embodiment of a side wall for a substrate cassette according to the present invention is illustrated. A side rail of the illustrated embodiment may be incorporated in each of side walls of a substrate cassette as shown in FIG. 2.

A side rail of the illustrated embodiment generally designated at reference numeral 1 generally includes a cover member 10 and a partition plate 20, which cooperate with each other to constitute a cover unit 3. The cover unit 3 thus formed is adapted to close each of side walls 41a and 41b of a substrate cassette 2 which are formed into a rectangular configuration, as shown in FIG. 2.

Figure 9:
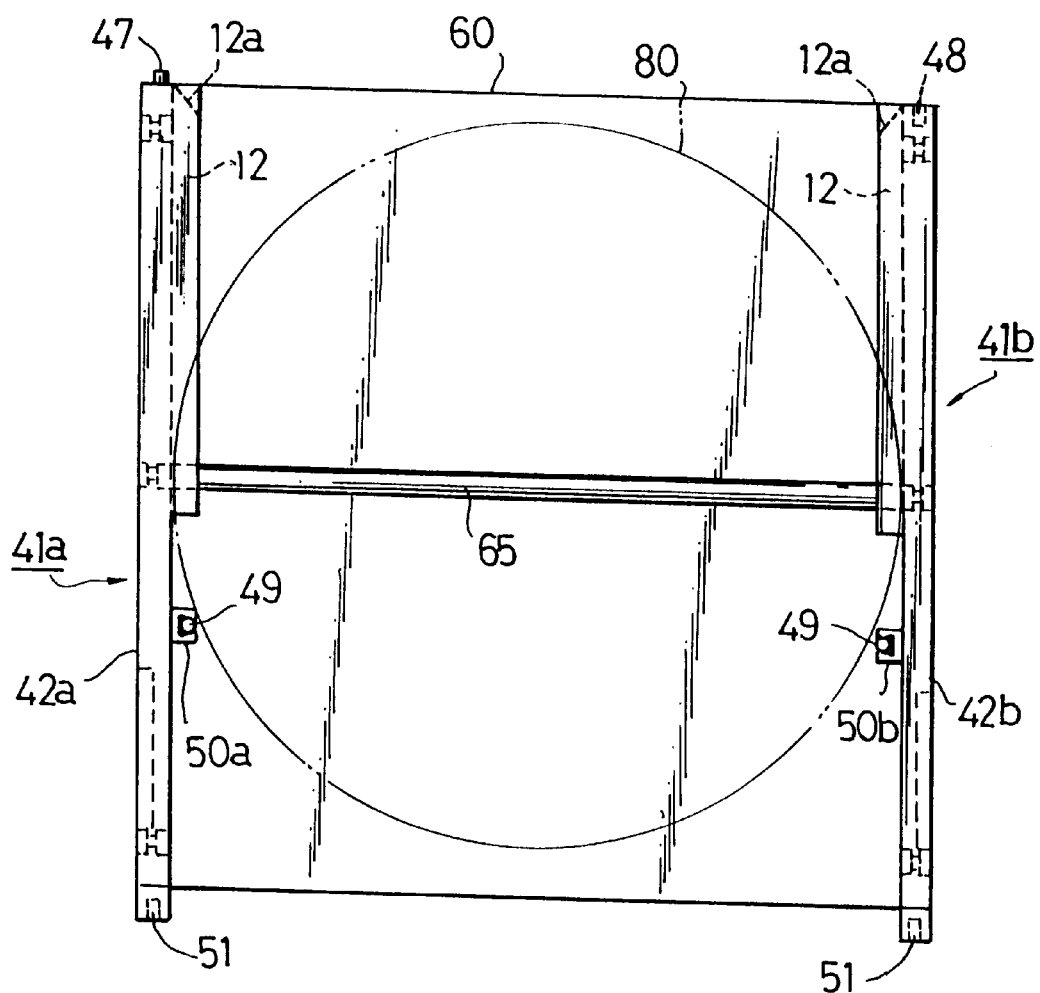
FIG. 9 is a side elevation view of the substrate cassette shown in FIG. 2.
Figure 11:
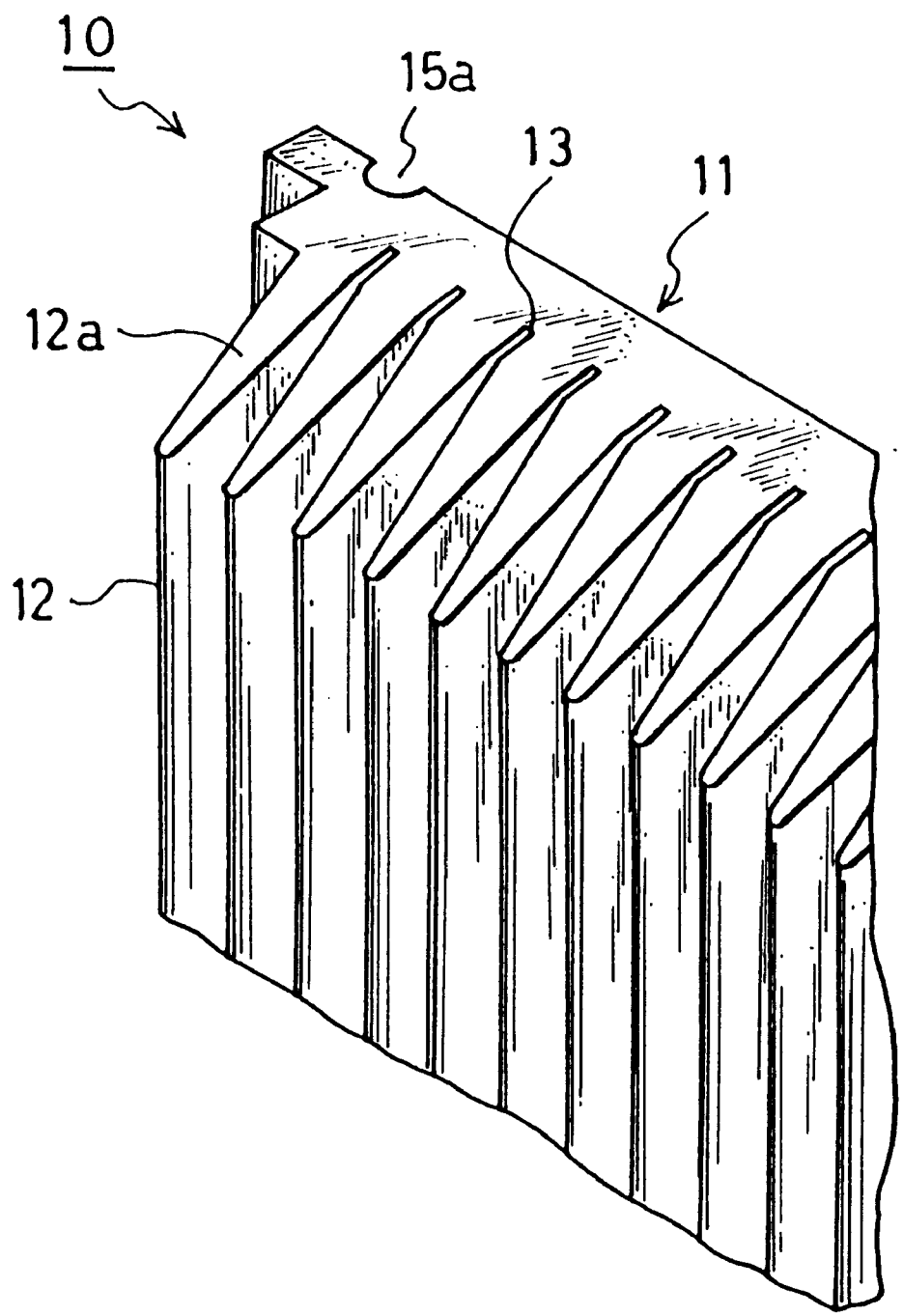
FIG. 11 is an enlarged perspective view showing a cover member of the side rail shown in FIG. 1.
Figure 12:
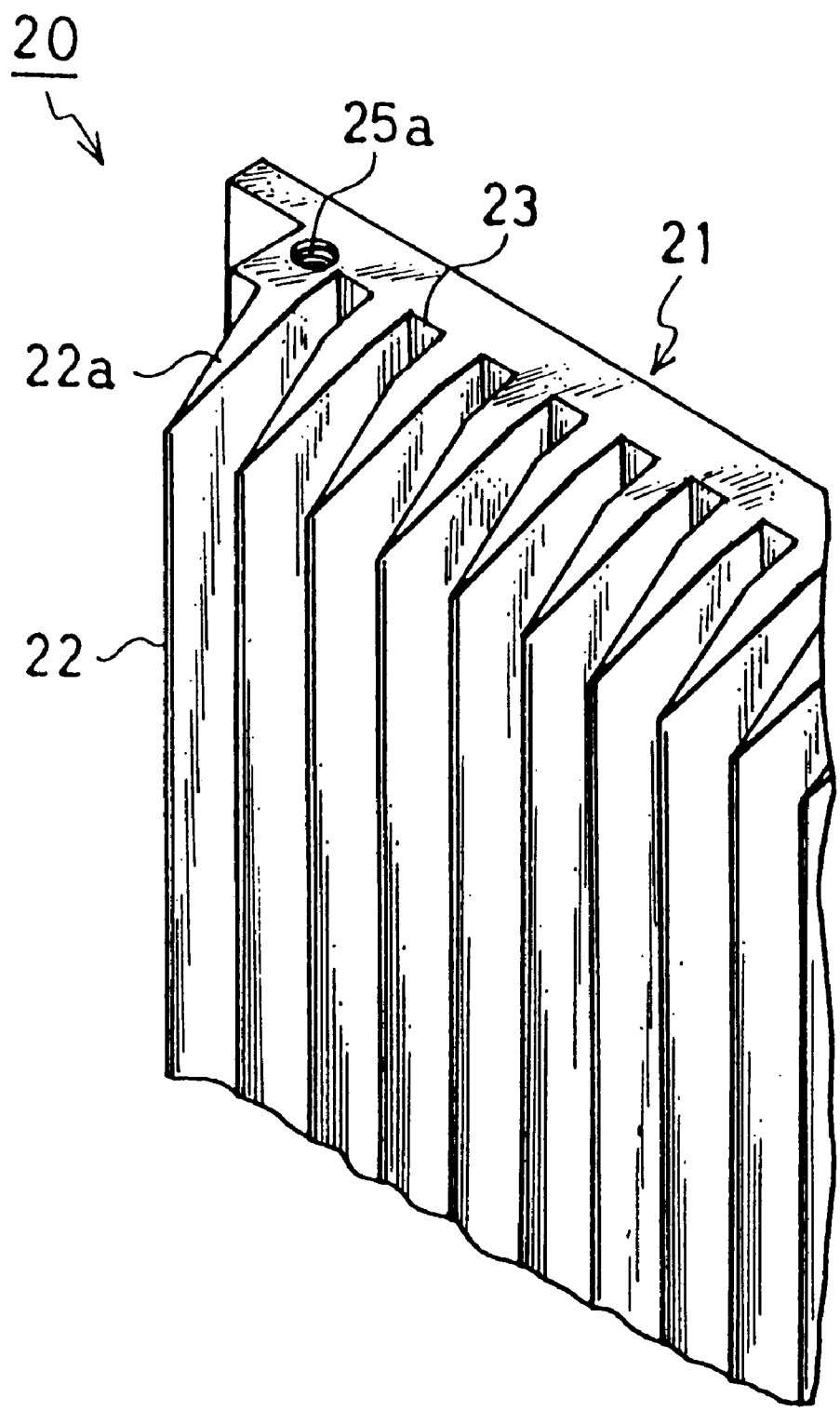
FIG. 12 is an enlarged perspective view showing a partition plate of the side rail shown in FIG. 1.
Figure 13:
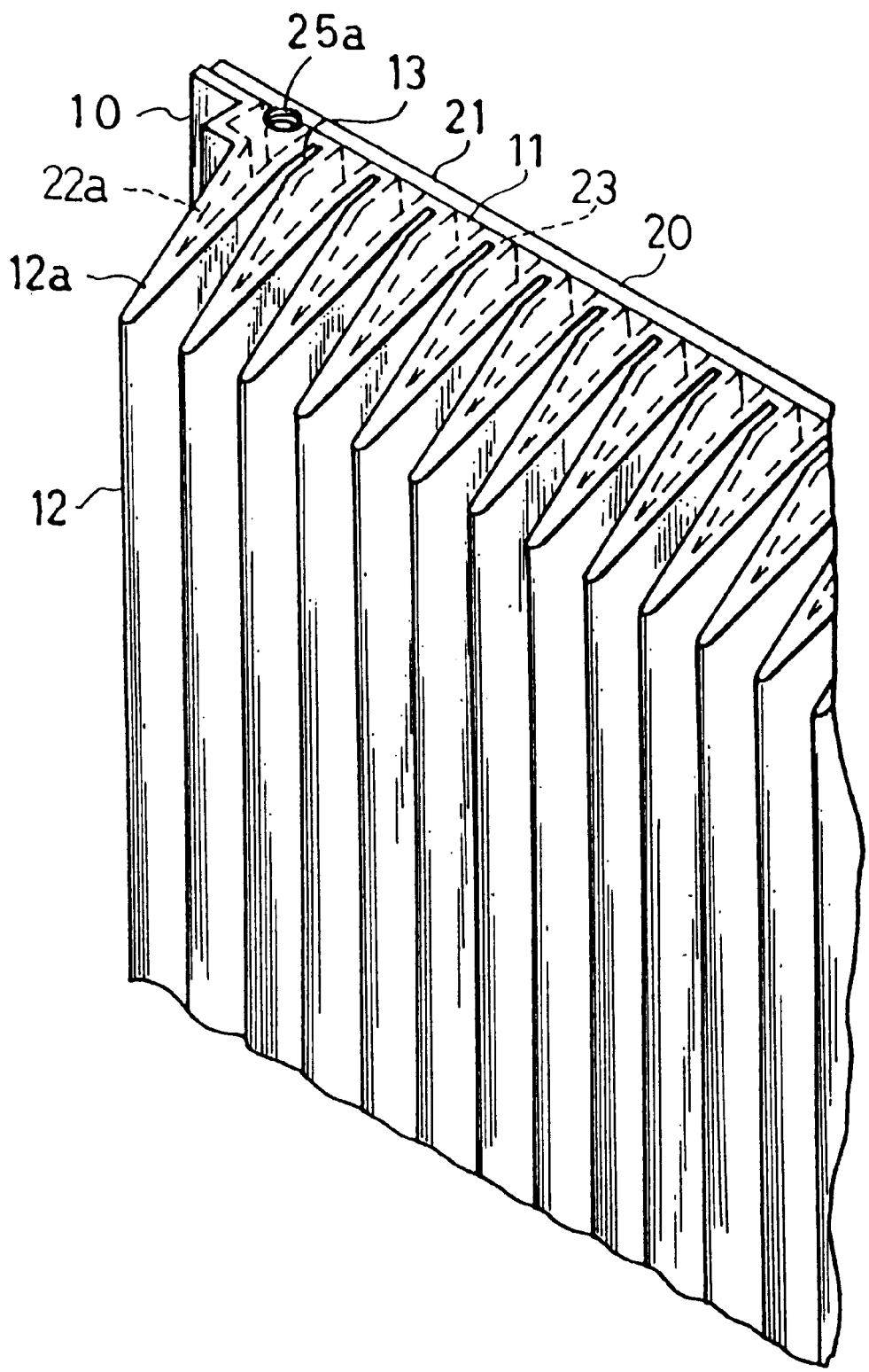
FIG. 13 is an enlarged perspective view of a cover member and a partition plate which constitute the side rail shown in FIG. 1, wherein the partition plate is covered with the cover member.
Figure 14:
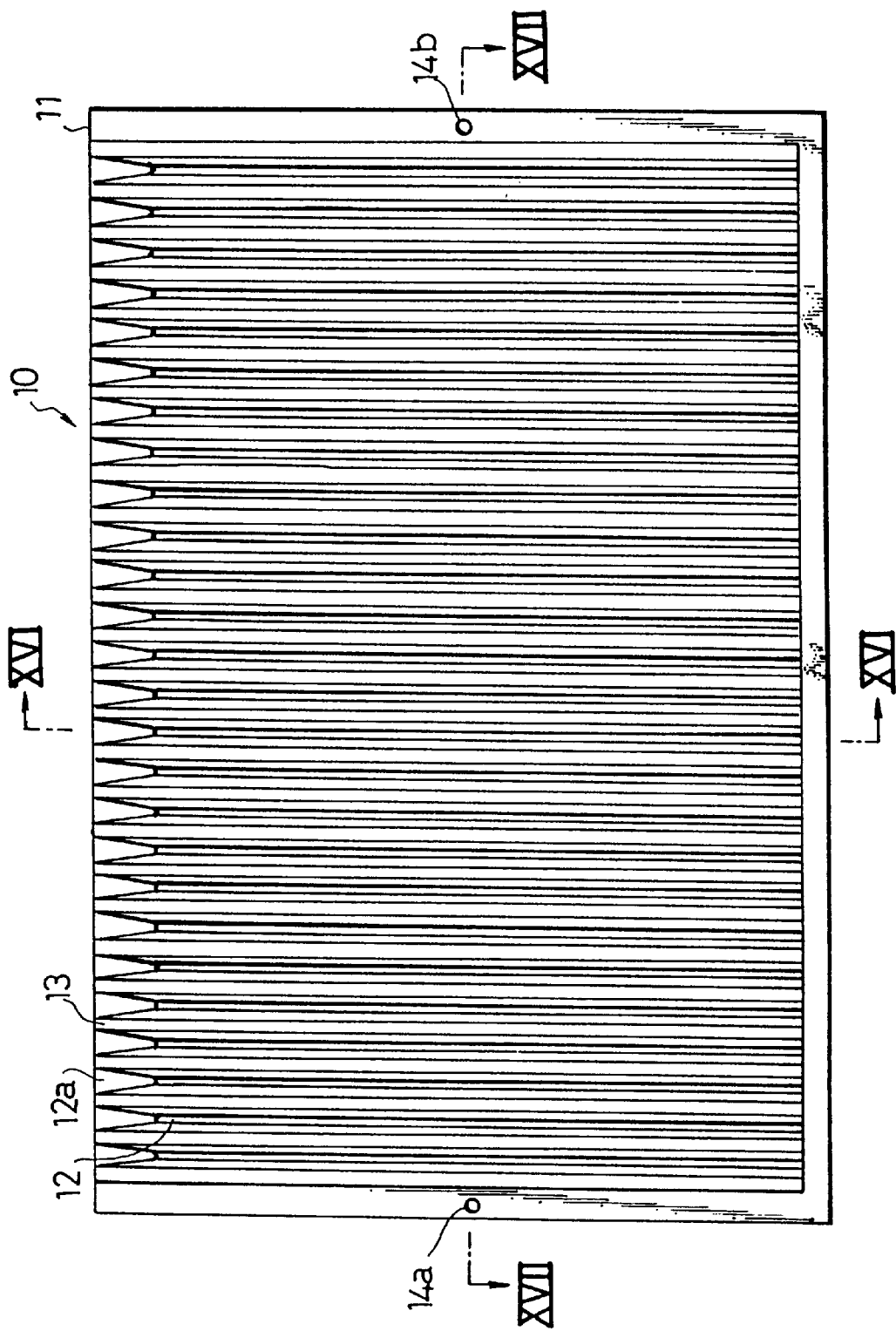
FIG. 14 is a front elevation view showing a cover member of the side rail shown in FIG. 1.
Figure 15:
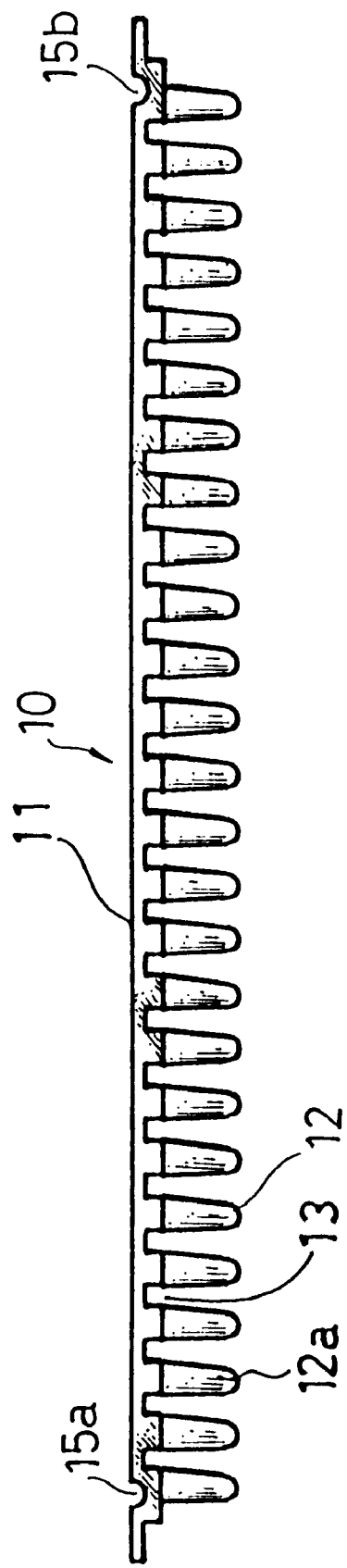
FIG. 15 is a plan view of the cover member shown in FIG. 14.
Figure 16:
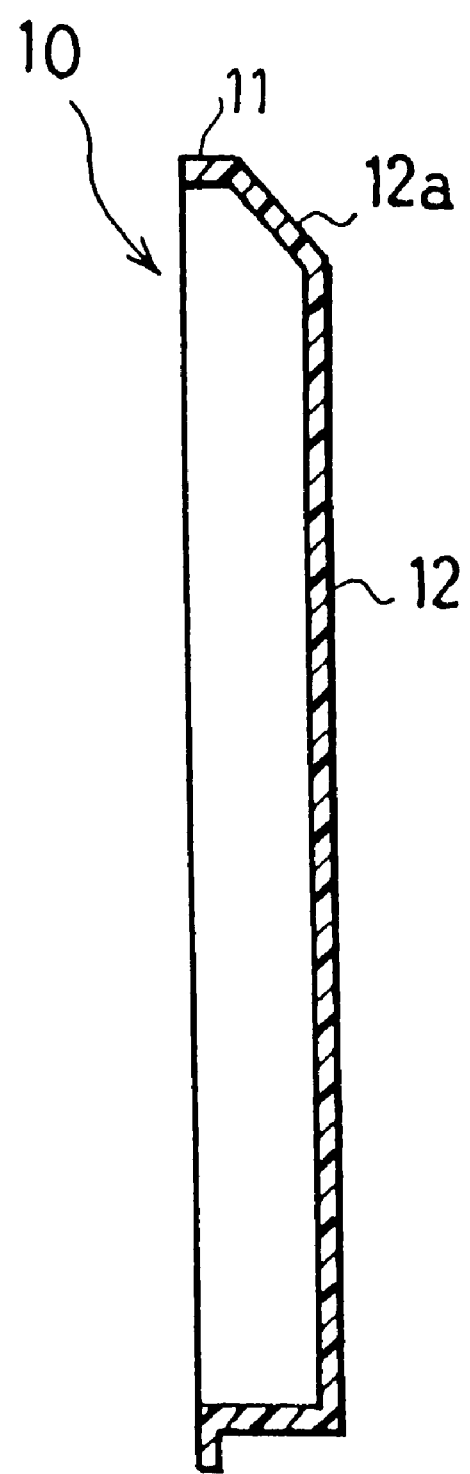
FIG. 16 is a sectional view taken along line XVI—XVI of FIG. 14.
Figure 17:
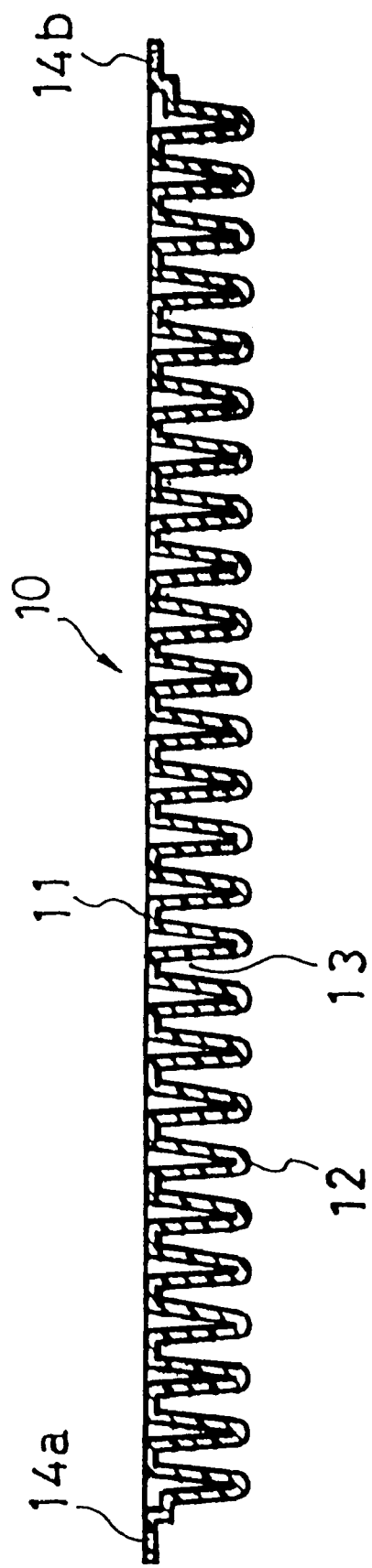
FIG. 17 is a sectional view taken along line XVII—XVII of FIG. 14.
Figure 18:
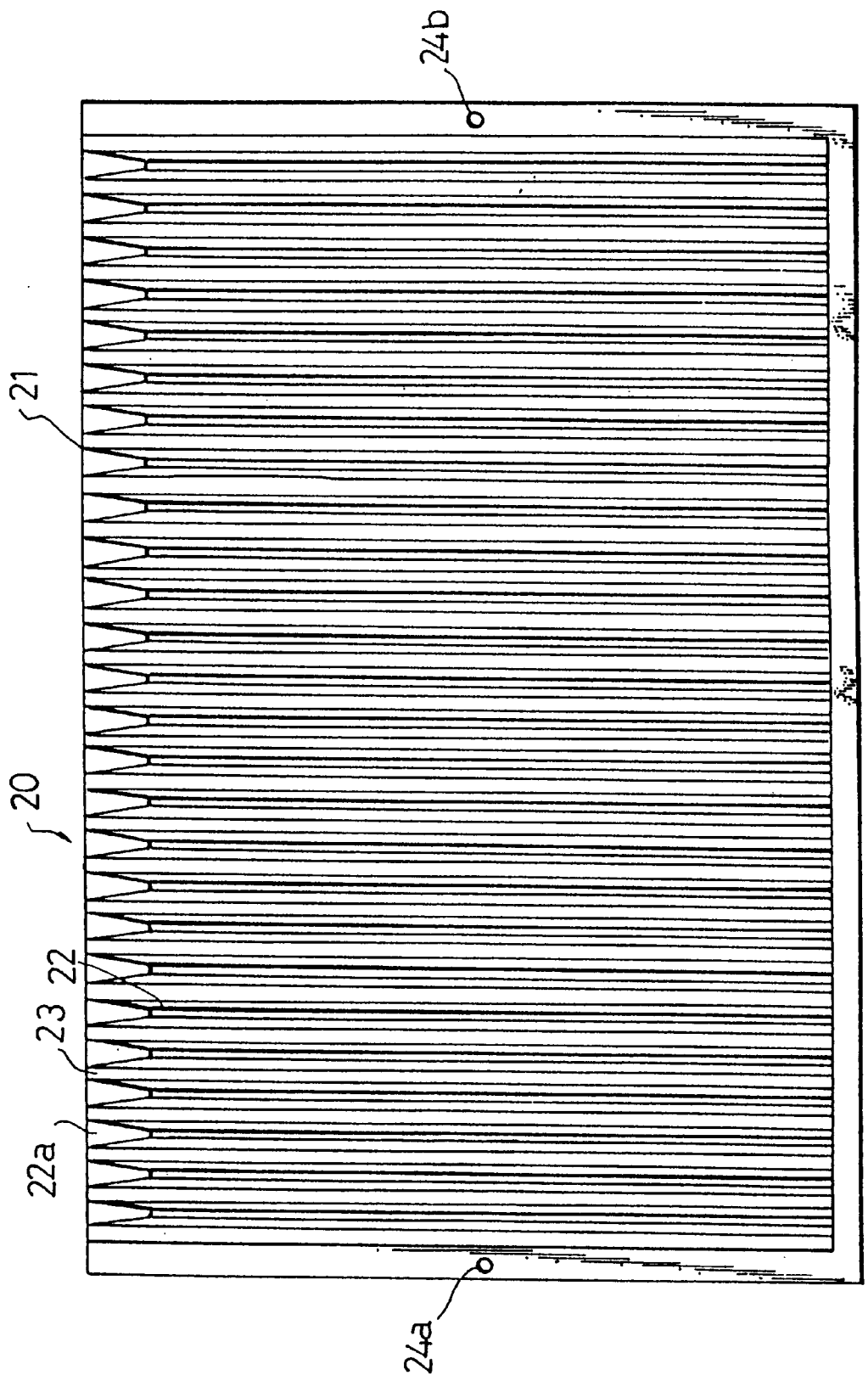
FIG. 18 is a front elevation view showing a partition plate of the side rail shown in FIG. 1.
Figure 19:
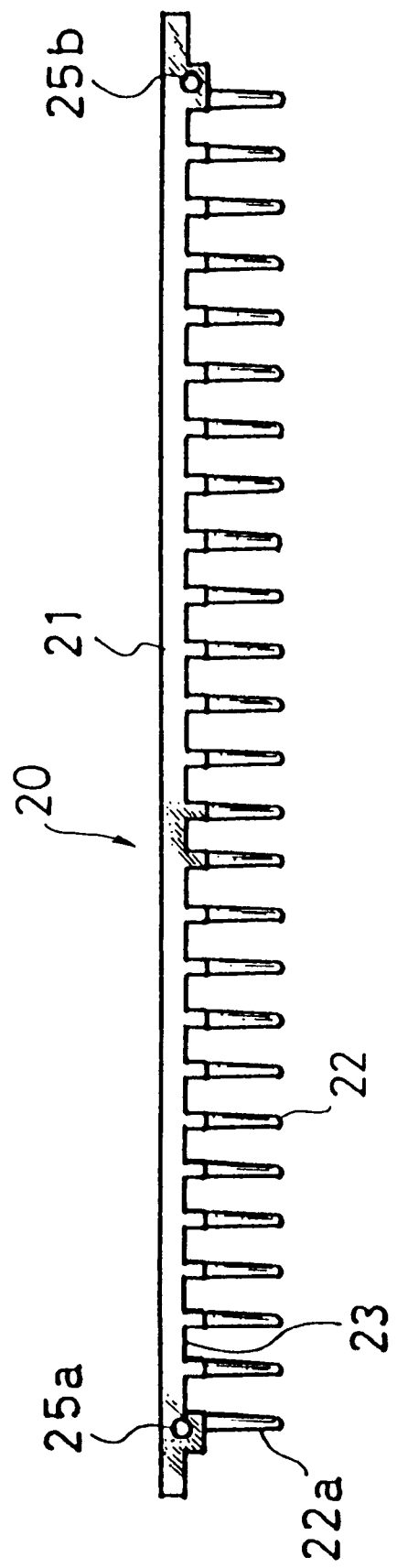
FIG. 19 is a plan view of the partition plate shown in FIG. 18.
Figure 20:
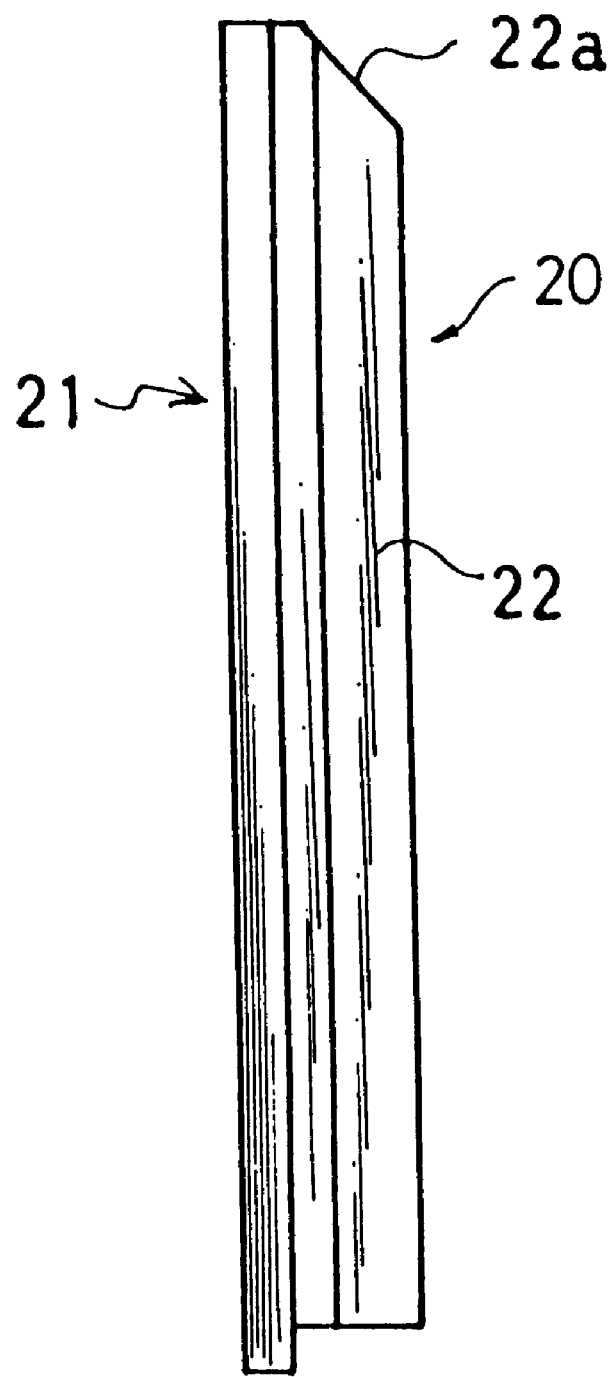
FIG. 20 is a left side elevation view of the partition plate shown in FIG. 18.

The partition plate 20 is formed on a surface thereof with a plurality of ribs 22 for receiving a plurality of substrates 80 therein in a manner to space them from each other, resulting in partition grooves 23 being defined therebetween, as shown in FIGS. 9 and 10. The ribs 22 each are formed on one surface of a flat plate section 21 of the partition plate 22 so as to project therefrom and the partition grooves 23 are arranged so as to be contiguous to the ribs 22, respectively. In the illustrated embodiment, the partition plate 20 is made of aluminum. The ribs 22 each are formed so as to have an inclined upper end surface 22a.

The flat plate section 21 is formed at both sides of an upper end surface thereof with threaded holes 25a and 25b in which mounting screws 33a and 33b are threadedly inserted. Also, the flat plate section 21 is formed at a central of side end portions thereof with through-holes 24a and 24b extending in a direction of thickness of the flat plate section 21 as shown in FIGS. 1 and 18 to 20. Mounting screws 46a are inserted via the through-holes 24a and 24b in order to mount the partition plate 20 on the side walls 41a and 41b of the substrate cassette 2. A material for the partition plate 20 is not limited to aluminum. It may be made of any suitable resin or rigid metal material. Selection of a suitable material for the partition plate 20 permits the plate 20 to be readily manufactured with increased accuracy.

The cover member 10 includes rib covers 12 for covering the ribs 22 and groove covers 13 each arranged between each adjacent two of the rib covers 12 so as to cover each of the partition grooves 23. The rib covers 12 are formed on one surface of a base section 11 of the cover member 10 so as to project therefrom, and the groove covers 13 are arranged so as to be contiguous to the rib covers 12, respectively. The rib covers 12 and groove covers 13 are formed of a resin material in a manner to be integral with each other. The rib covers 12 each are formed at an upper end portion thereof with an inclined surface 12a so as to correspond in configuration to the inclined surface 22a of the partition plate 20.

The base section 11 is formed at portions of both sides of an upper end surface thereof positionally corresponding to the threaded holes 25a and 25b of the partition plate 20 with cutouts 15a and 15b. Also, the base section 11 is formed at a center of side end portions thereof positionally corresponding to the through-holes 24a and 24b of the partition plate 20 with screw inserting holes 14a and 14b extending in a direction of thickness of the base section 11. The cover member 10 may be formed into a thickness of about 0.8 to 1.2 mm and preferably about 1.0 mm. The thickness is preferably substantially uniform. Also, the cover member 10 may be made of any suitable resin such as tetrafluoroethylene-perfluoroethylene alkylvinyl ether copolymer (PFA), polyether etherketone (PEEK) or the like. The cover member 10 is constructed in such a manner as shown in FIGS. 14 to 17.

The side rail 1 also includes a fixing means 30 arranged on an upper end of the cover member 10 and partition plate 20 to integrally securely connect the cover member 10 and partition plate 20 to each other. The fixing means 30 includes a holding plate 31 formed with mounting holes 32a and 32b in a manner to positionally correspond to the threaded holes 25a and 25b of the flat plate section 21 and the cutouts 15a and 15b of the base section 11, respectively. The fixing means 30 also includes mounting screws 33a and 33b respectively inserted into the mounting holes 32a and 32b to securely connect the partition plate 20 and cover member 10 to each other.

Thus, the cover member 10 and partition plate 20 are formed so as to be detachably connected to each other. The partition plate 20 is covered with the cover member 10 and both are integrally securely connected to each other by means of the fixing means 30 arranged on the upper end thereof. Such construction of the cover member 10 and partition plate 20, even when warpage of the cover member 10 occurs, permits the warpage to be forcibly rectified by the partition plate 20. Also, it effectively prevents the cover member 10 from being separated from the partition plate 20 during receiving of the substrates in the side rail 1 and permits replacement of the cover member 10 to be carried out by merely releasing the fixing means 30.

As described above, the side rail 1 of the illustrated embodiment includes the partition plate 20 provided with the ribs 22 for spacing the substrates from each other and the partition grooves 23 defined between the ribs 22 and the cover member 10 provided with the rib covers 12 for covering the ribs 22 and the groove covers 13 for covering the partition grooves 23. Thus, the illustrated embodiment permits static electricity charged on a side of the base section 11 of the cover member 10 to be discharged to the partition plate 20, to thereby prevent the static electricity from adversely affecting peripheral equipments.

The cover member 10 and partition plate 20 may be integrally made of a resin material as described hereinafter, so that manufacturing of the cover unit 3 may be further facilitated.

Figure 21:
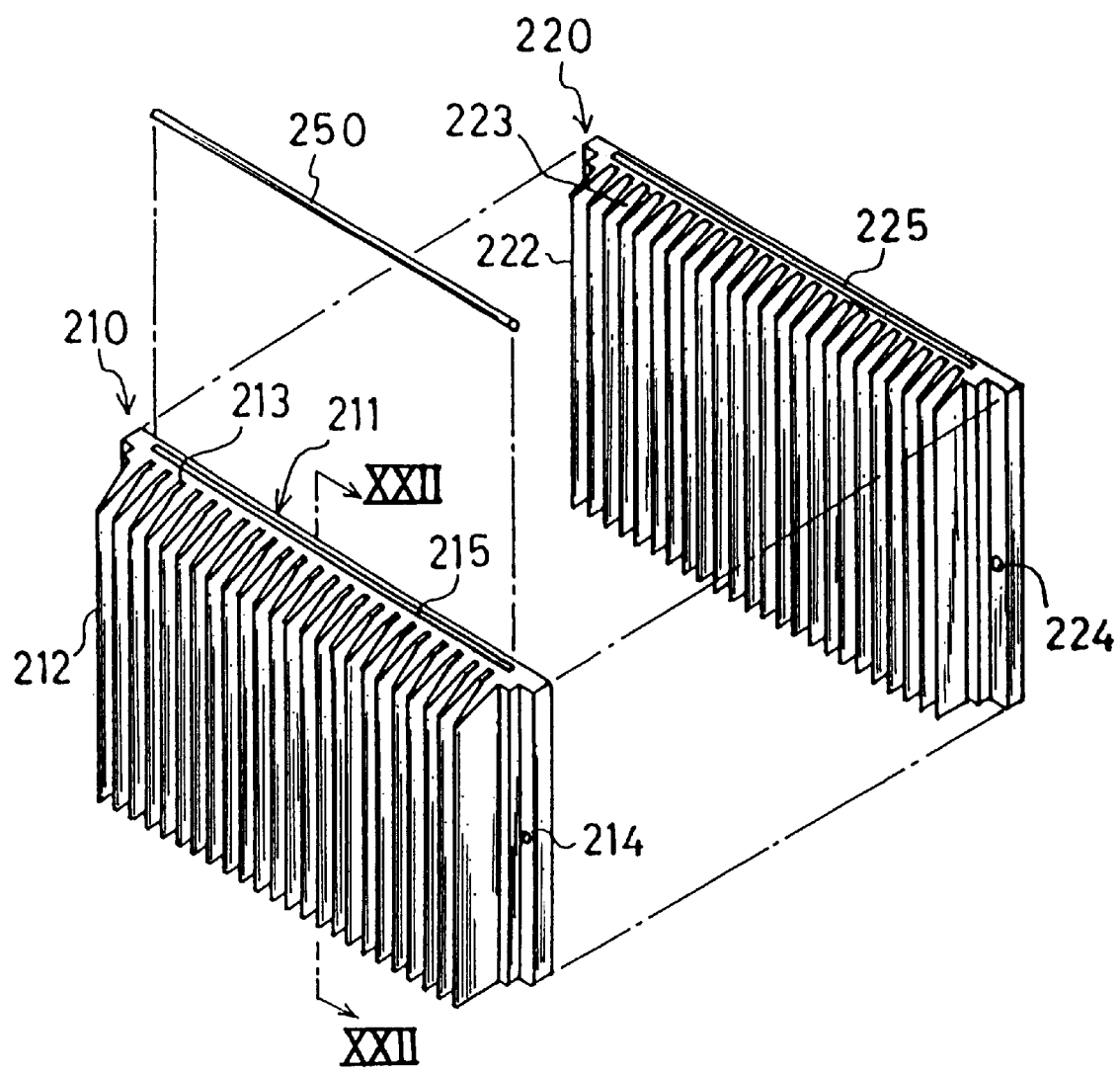
FIG. 21 is an exploded perspective view showing a modification of a fixing means of the side rail shown in FIG. 1.
Figure 22:
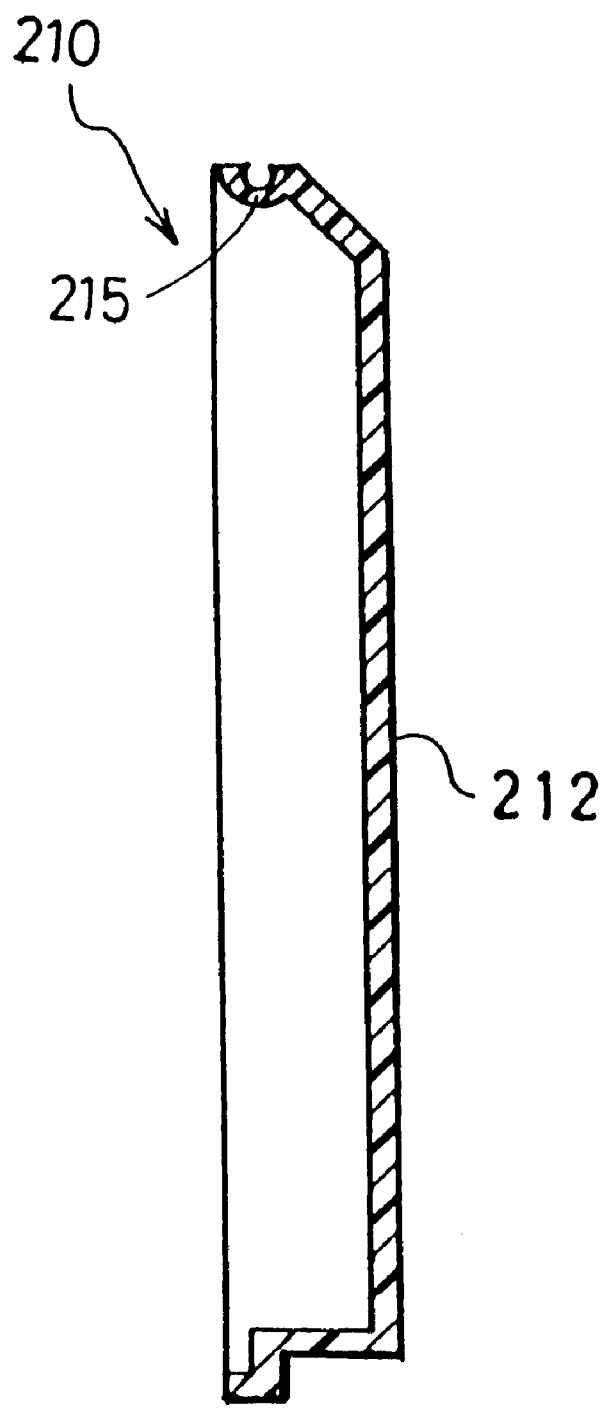
FIG. 22 is a sectional view taken along line XXII—XXII of FIG. 21.

Alternatively, the fixing means may be constructed in such a manner as shown in FIGS. 21 and 22. A modification of the fixing means shown in FIGS. 21 and 22 may be constituted by a downwardly projecting elongated projection 215 formed on an upper or top surface of a cover member 210 so as to extend in a longitudinal direction thereof, an elongated recess 225 formed on an upper or top surface of a partition plate 220 so as to fittedly receive the projection 215 of the cover member 210 therein, and a bar-like member 250 fitted in a rear groove of the projection 215 of the cover member 210 formed when the projection 215 of the cover member 210 is fitted in the recess 225 of the partition plate 220. In FIGS. 21 and 22, reference numeral 211 designates a base section, 212 is rib covers, 213 is groove covers, 214 is screw mounting holes, 222 is ribs, 223 is partition grooves and 224 is through-holes. In the modification shown in FIGS. 21 and 22, the projection 215 of the cover member 210 is fitted in the recess 225 of the partition plate 220 and then the bar-like member 250 is fitted in the rear groove of the projection 215, so that the cover member 210 may be readily fixed with respect to the partition plate 220 by a one-touch operation.

Figure 23:
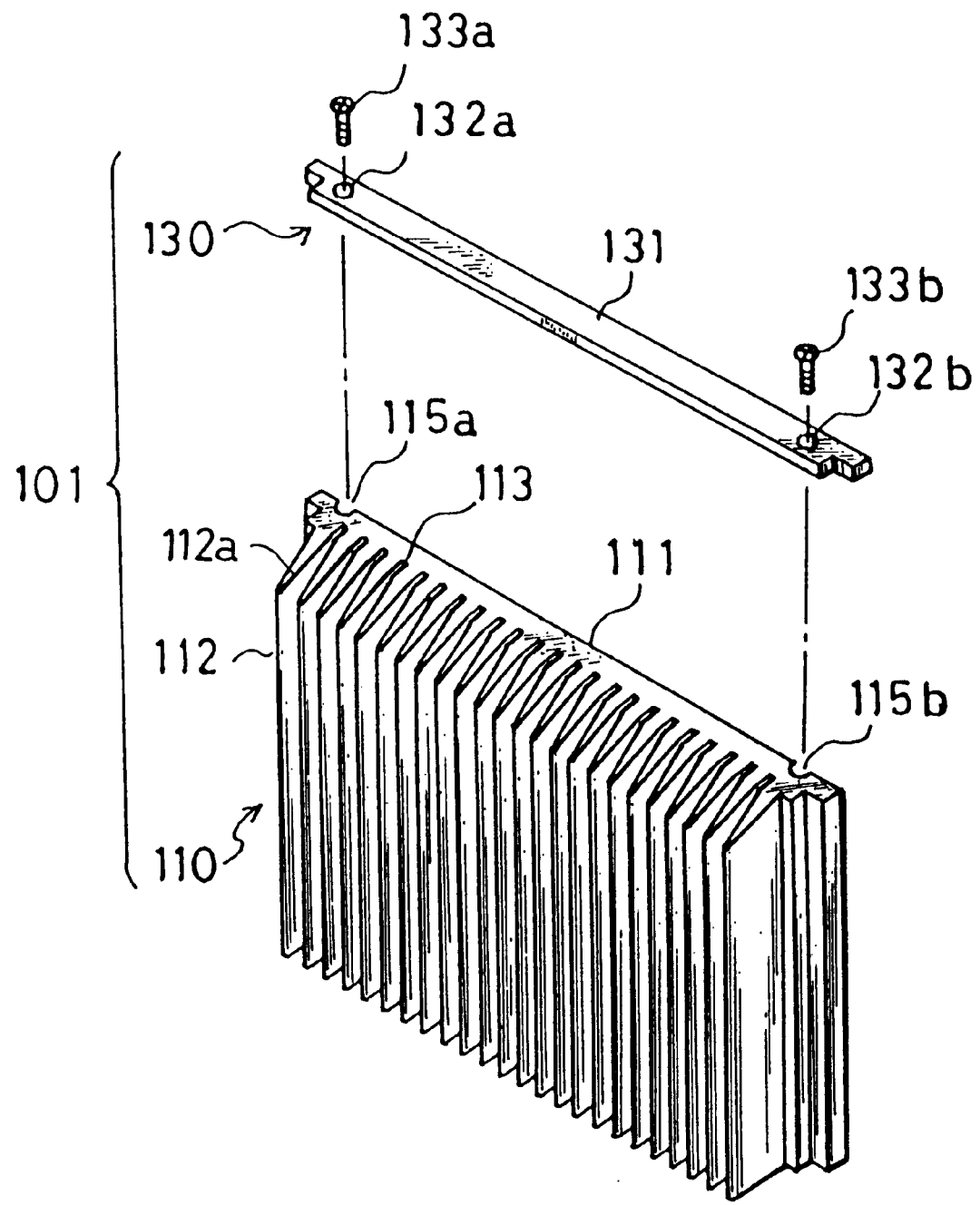
FIG. 23 is an exploded perspective view showing another embodiment of a side rail according to the present invention.
Figure 24:
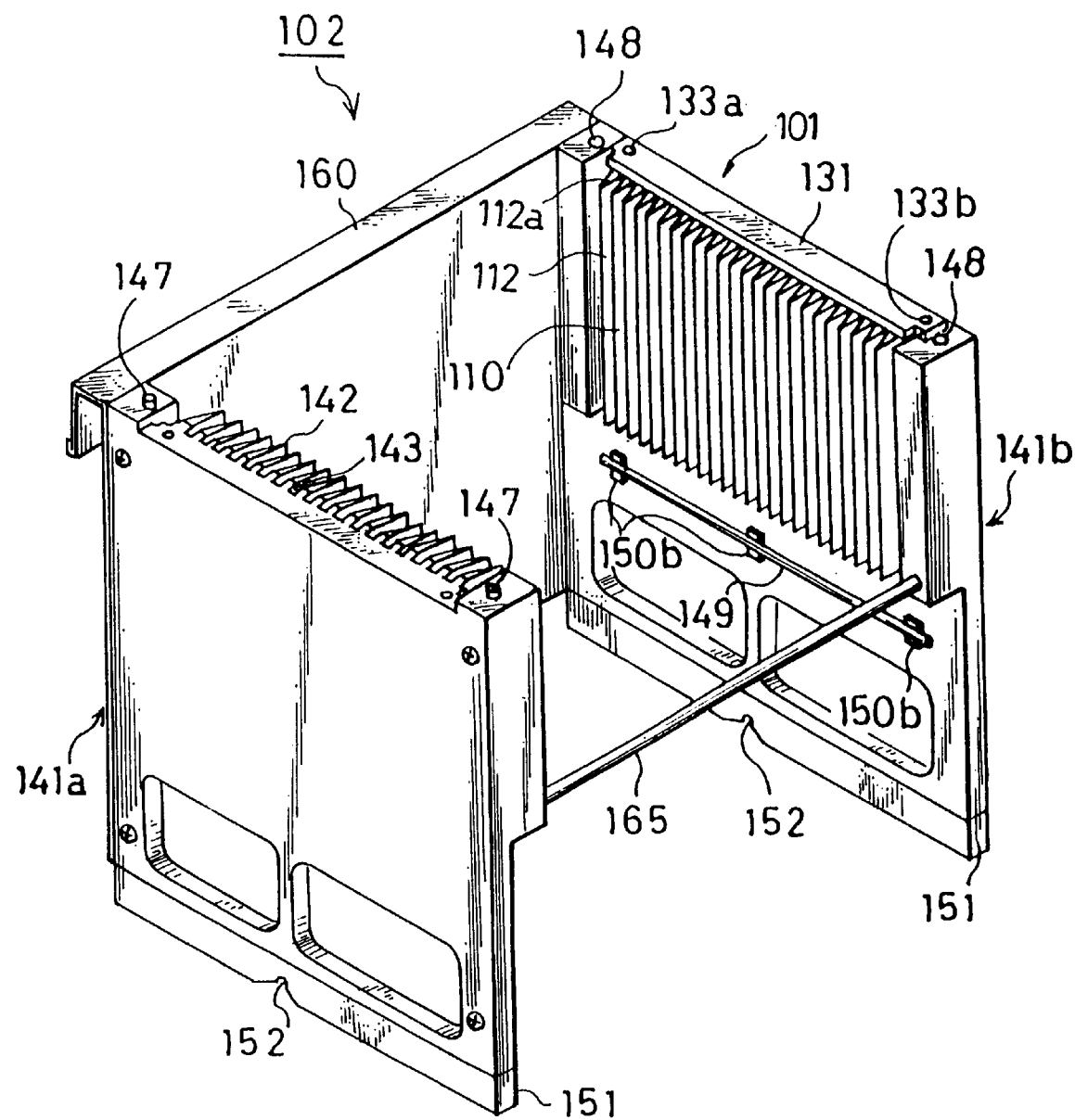
FIG. 24 is a perspective view showing a substrate cassette according to the present invention which has the side rail of FIG. 23 incorporated in one of side walls thereof.

Referring now to FIGS. 23 and 24, another embodiment of a side rail for a substrate cassette according to the present invention is illustrated, wherein FIG. 23 shows a side rail of the illustrated embodiment and FIG. 23 shows a substrate cassette in which side rails each constructed as shown in FIG. 23 are incorporated.

First, a substrate cassette 102 in which side rails 101 each constructed as shown in FIG. 24 are incorporated will be described. The substrate cassette 102 includes a pair of side walls 141a and 141b arranged so as to be opposite to each other and a connection means 160 and 165 such as an end wall and the like for connecting the side walls 141a and 141b to each other. In the illustrated embodiment, a part 160 of the connection means 160 and 165 comprises an end wall and the remaining part 165 of the connection means 160 and 165 comprises a rod. The side walls 141a and 141b each are formed on an inner surface thereof with ribs 142 constituting a part of each of the side walls 141a and 141b, as well as partition grooves 143 defined between the ribs 142. The side walls 141a and 141b and connection means 160 and 165 are combined together in a rectangular configuration.

The side rails 101 incorporated in a pair in the substrate cassette 102 each include rib covers 112 for covering the ribs 142 and groove covers 113 formed between the rib covers 112 so as to cover the partition grooves 143, which cooperate with each other to form a cover unit 110, which is then mounted on each of the side walls 141a and 141b of the substrate cassette 102.

Figure 2:
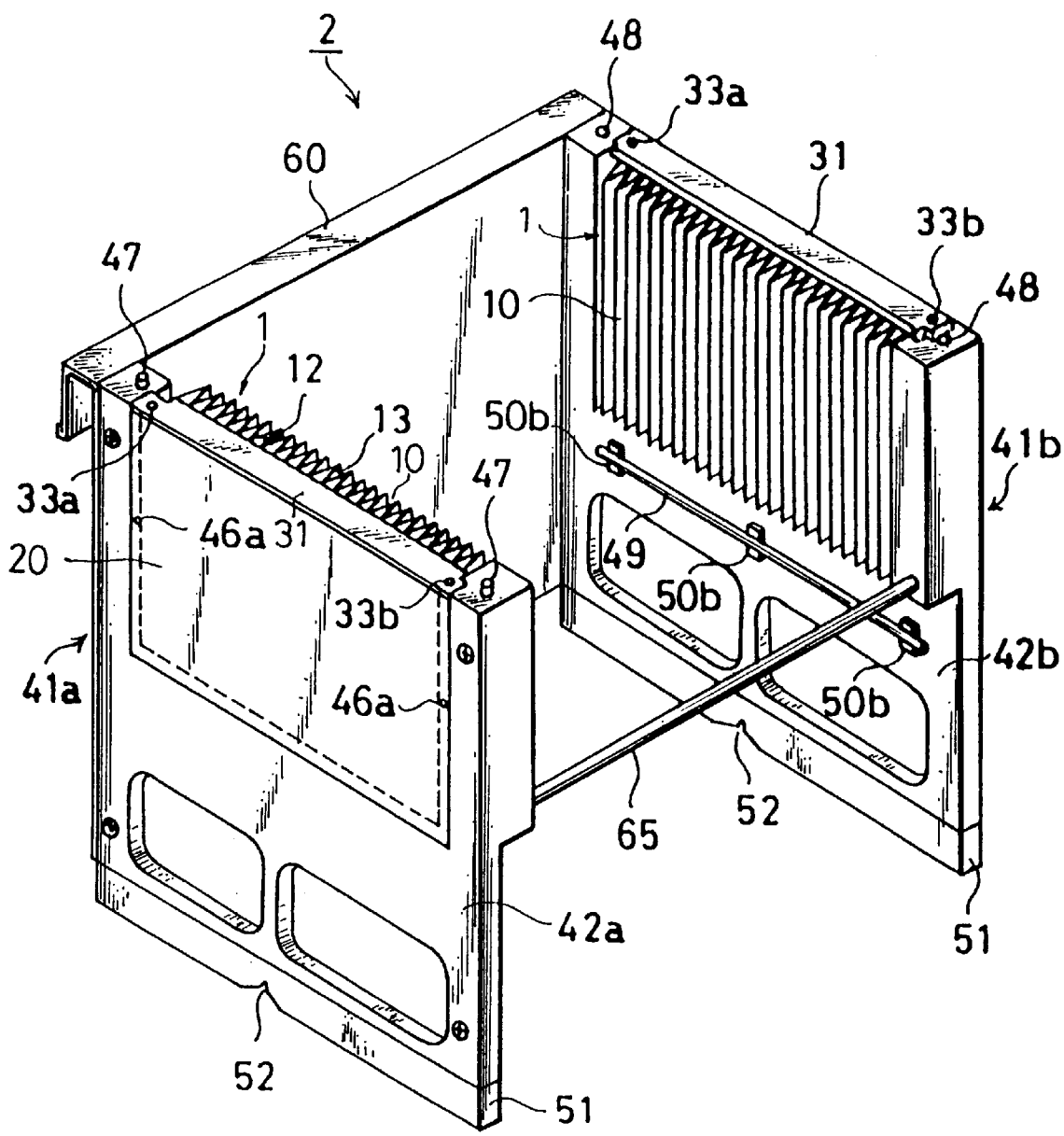
FIG. 2 is a perspective view showing an embodiment of a substrate cassette according to the present invention in which side rails each constructed as shown in FIG. 1 are incorporated.

The side rail 101 constructed into the cover unit 110 is formed into substantially the same configuration as the cover member 10 shown in FIG. 1 and includes a base section 111 which is formed on one surface thereof with the above-described rib covers 112 in a manner to project therefrom. The groove covers 113 each are arranged between each adjacent two of the rib covers 112 in a manner to be contiguous to the rib covers 112. The rib covers 112 and groove covers 113 may be formed of a resin material into an integral structure. The rib covers 112 each are formed at an upper end thereof with an inclined surface 112a so as to correspond to an inclined surface of each of the ribs 142 of each of the side walls 141a and 141b. Also, the base section 111 is formed on both sides of an upper end surface thereof with cutouts 115a and 115b in a manner to positionally correspond to threaded holes formed at a top surface of the substrate cassette 102.

Thus, the cover unit 110 constituting the side rail 101 is integrally fixedly mounted on an inner surface of each of the side walls 141a and 141b of the substrate cassette 102 using a fixing means 130. Release of the fixing means 130 permits the cover unit 110 to be removed from the substrate cassette 102.

The fixing means 130 may be constructed in substantially the same manner as the fixing means 30 shown in FIG. 1. More particularly, it includes a holding plate 131 formed with mounting holes 132a and 132b and arranged on the substrate cassette 102 and cover unit 110 and mounting screws 133a and 133b respectively inserted through the mounting holes 132a and 132b of the holding plate 131 to securely connect the substrate cassette 102 and cover unit 110 to each other. In FIG. 24, reference numeral 147 is pins, 148 is pin holding holes, 149 is stoppers, 150b is stopper holders, 151 is legs, and 152 is cutouts.

As can be seen from the foregoing, the side rail 101 of the illustrated embodiment constructed in the form of the cover unit 110 including the rib covers 112 for covering the ribs 142 and the groove covers 113 for the partition grooves 143 each defined between each adjacent two of the ribs 142. Thus, selection of a suitable material for the cover unit 110 reduces production of particles due to contact of the cover unit 110 with substrates and prevents pollution of the substrates with heavy metal. Also, when only the cover unit 110 is made of a resin material, generation of outer gas is minimized, to thereby substantially restrain the substrates from being adversely affected by the outer gas.

Now, the substrate cassette 2 of the present invention will be described hereinafter with reference to FIGS. 2 to 10.

The substrate cassette 2 includes the side rails 1 each constructed as described above, as well as the side walls 41a and 41b arranged opposite to each other and respectively formed with windows 43a and 43b and a connection means 60 and 65 such as an end wall and the like for connecting the side walls 41a and 41b to each other. The windows 43a and 43b each are closed by the side rail 1.

Figure 6:
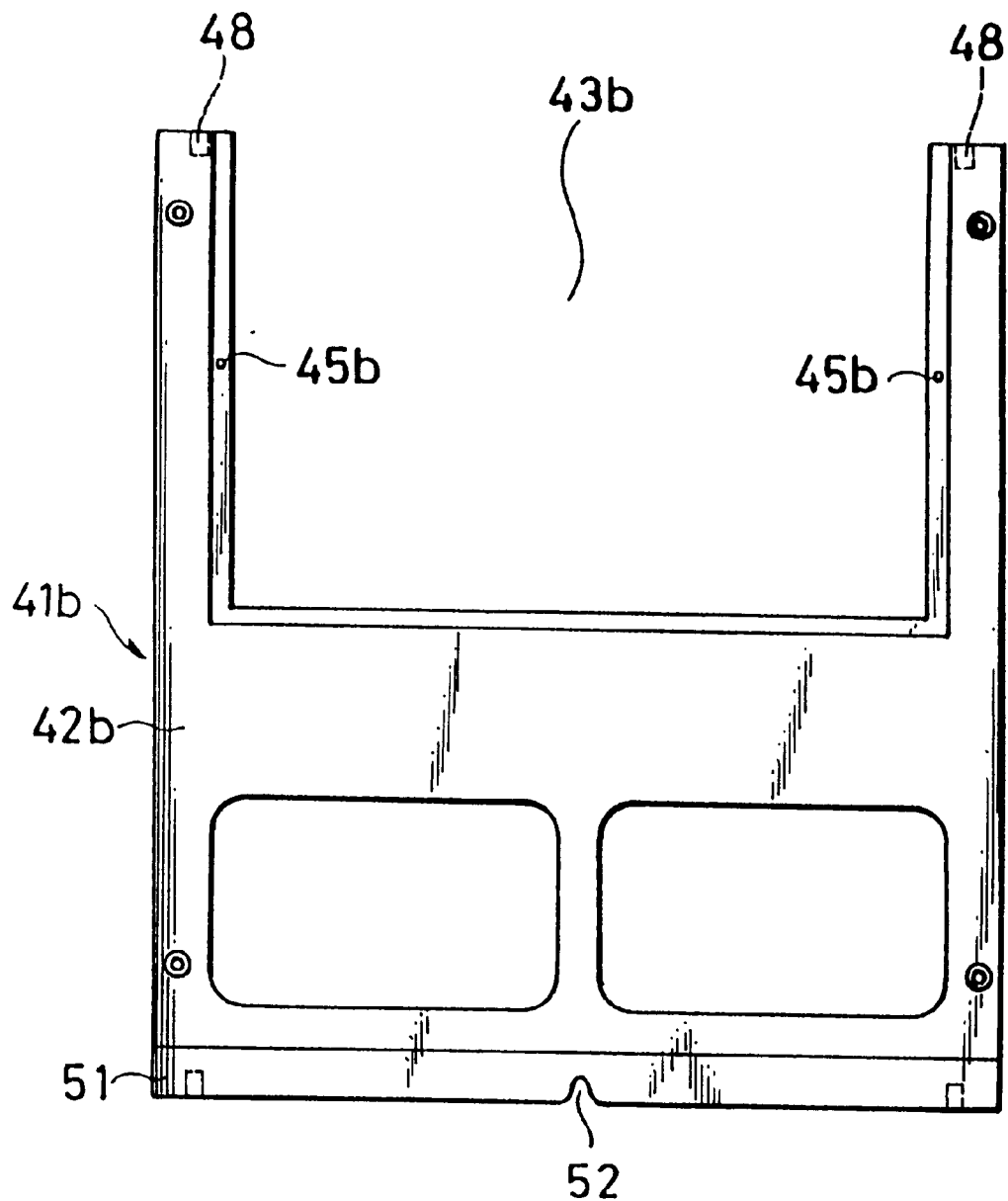
FIG. 6 is an outside front elevation view showing each of side walls of the substrate cassette shown in FIG. 2, which is viewed from an outside of the substrate cassette.

The side walls 41a and 41b include frames 42a and 42b provided with the windows 43a and 43b in each of which the side rail 1 is mounted, respectively. The windows 43a and 43b are formed at an upper half of the frames 42a and 42b in a manner to be open at an upper portion thereof. The frames 42a and 42b are provided at a portion thereof defining the windows 43a and 43b with mounting steps 44a and 44b, respectively. The mounting steps 44a and 44b are formed at a central portion of both sides thereof with mounting holes 45a and 45b for mounting the side rails 1 on the side walls 41a and 41b as shown in FIG. 6, respectively. Mounting of the side rail 1 in each of the side walls 41a and 41b is carried out by fitting the cover member 10 and partition plate 20 integrally connected to each other in each of the windows 43a and 43b and inserting the above-described mounting screws 46a (FIGS. 2 and 3) via the through-holes 24a and 24b of the partition plate 20 and the screw mounting holes 14a and 14b of the cover member 10, followed by threaded fitting of the screws 46a in the mounting holes 45a (45b) of each of the windows 43a and 43b. Release of the side rails 1 from the frames 42a and 42b is carried out by disengaging the screws 46a from the frames 42a and 42b.

Figure 3:
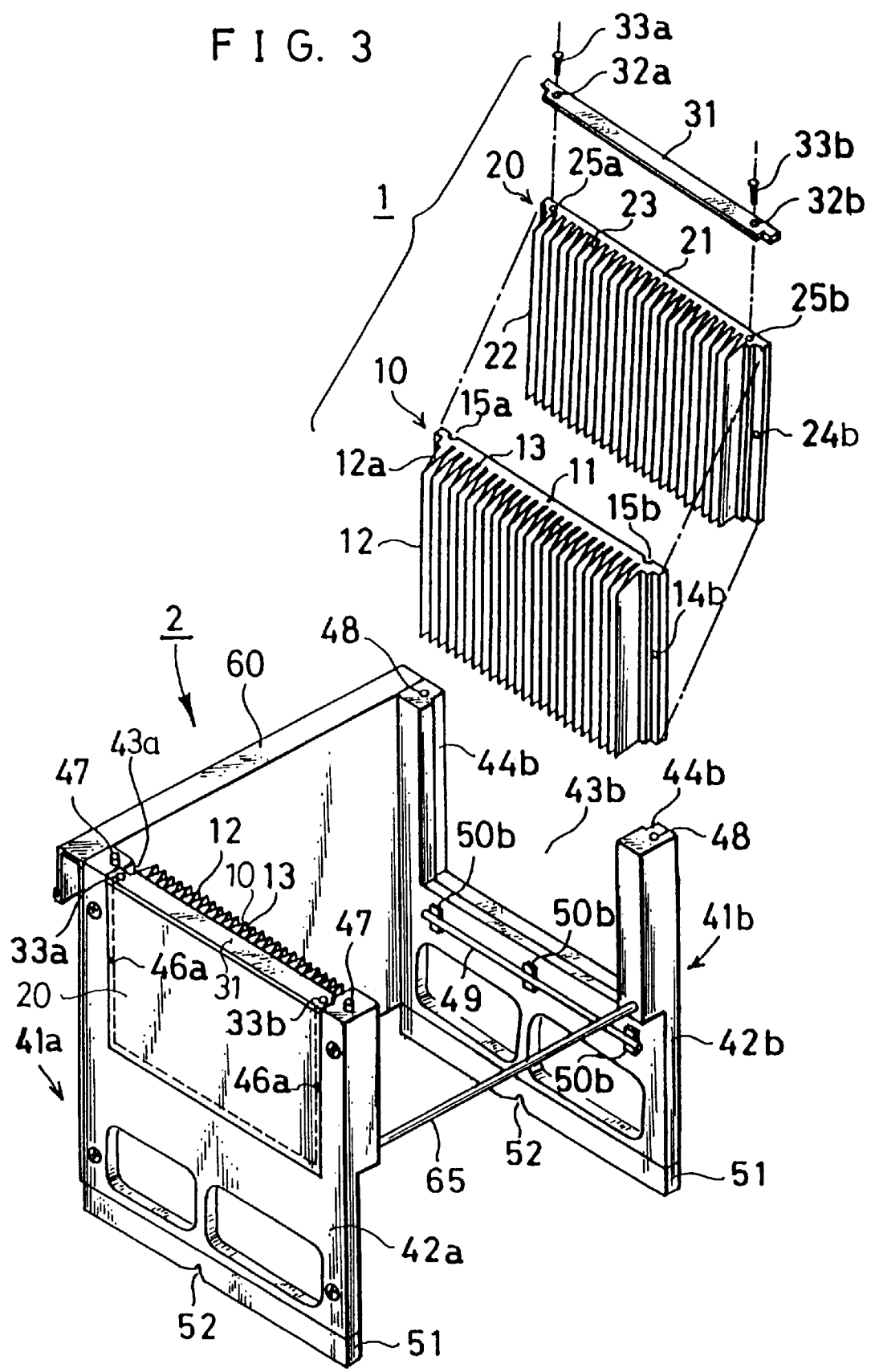
FIG. 3 is an exploded perspective view of the substrate cassette shown in FIG. 2.
Figure 4:
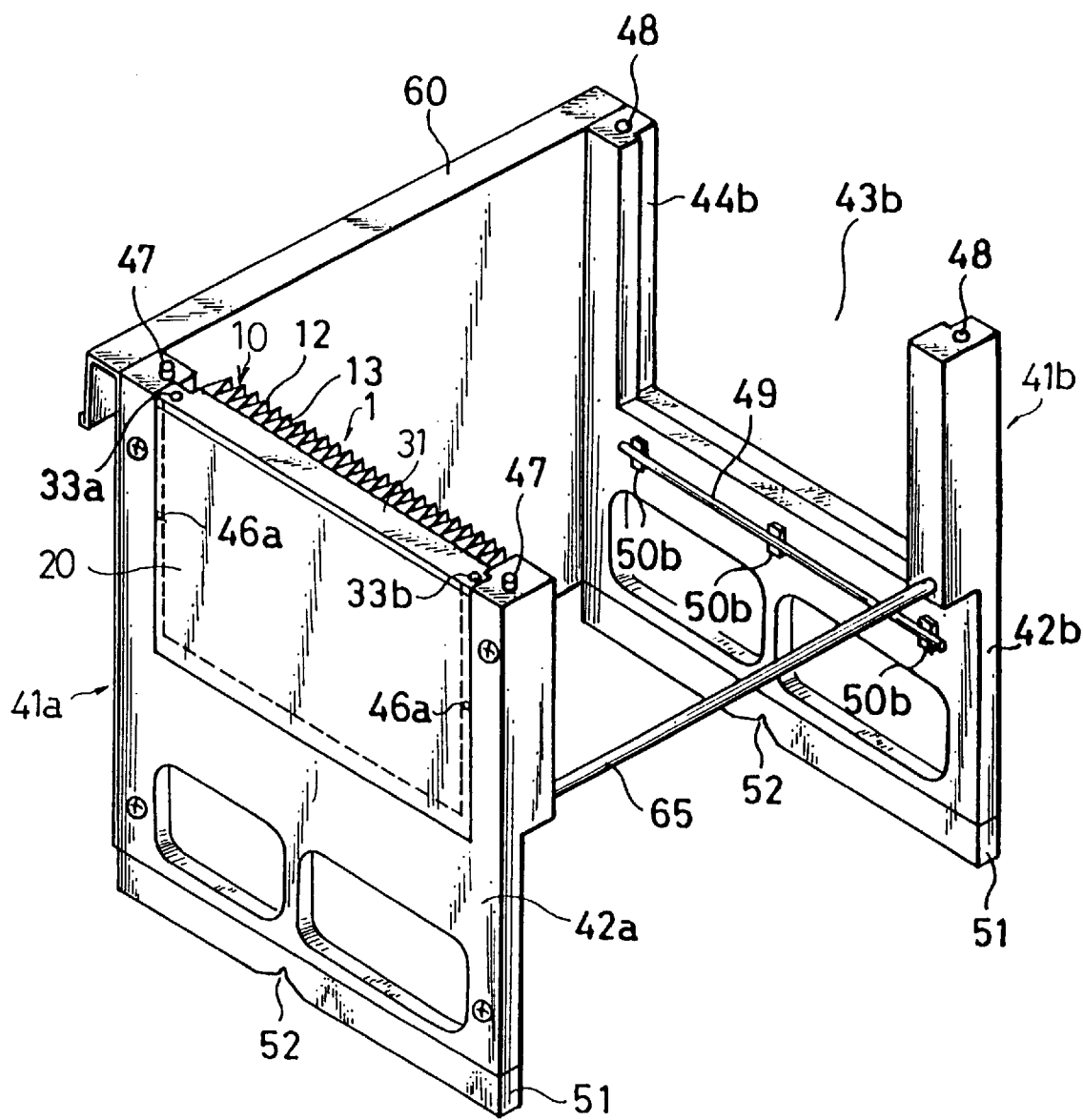
FIG. 4 is a perspective view of the substrate cassette shown in FIG. 2, form which one of the side rails is eliminated for the sake of brevity.
Figure 5:
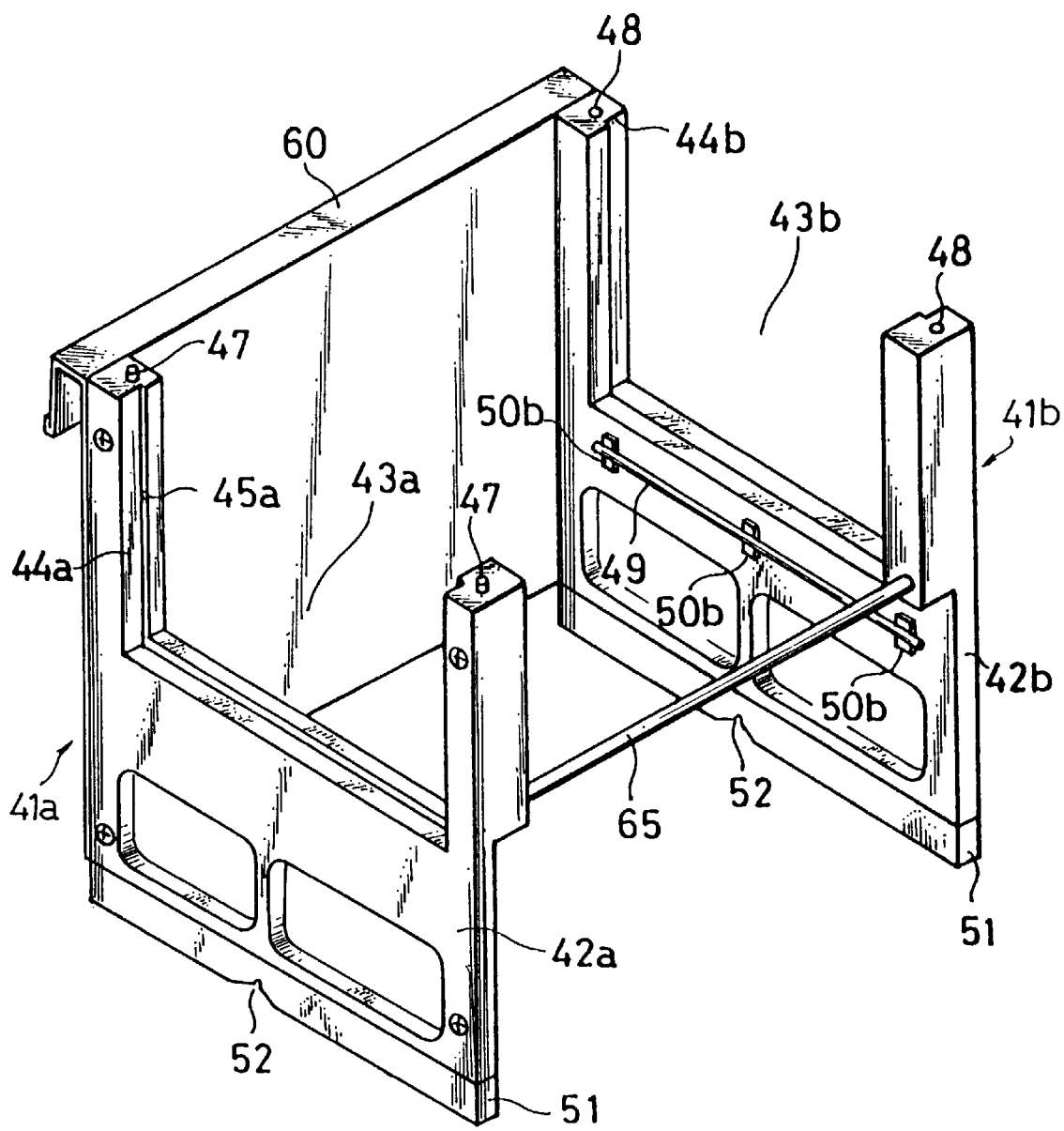
FIG. 5 is a perspective view of the substrate cassette shown in FIG. 2, form which both side rails are eliminated for the sake of brevity.
Figure 7:
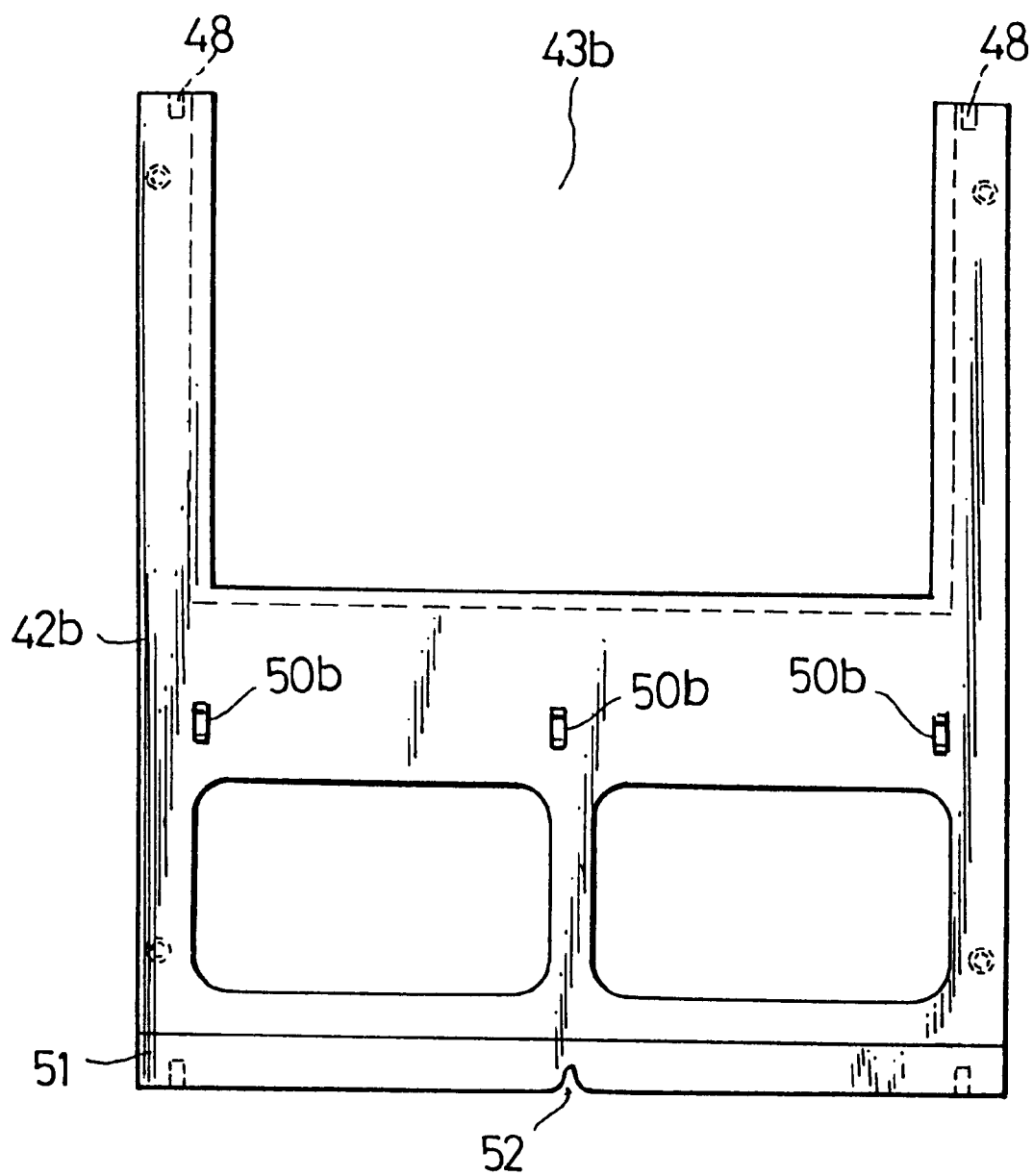
FIG. 7 is an inside front elevation view of the side wall shown in FIG. 6, which is viewed from an inside of the substrate cassette.

The frames 42a and 42b are provided at a portion of an inner surface thereof below the windows 43a and 43b with stopper holders 50a and 50b for holding rod-like stoppers 49 functioning to stationarily arrange the substrates 80 at a predetermined position in the substrate cassette 2 when the substrates 80 are received in the substrate cassette 2, as shown in FIGS. 3, 7 and 9.

The frame 42a is provided on an upper or top surface thereof with pins 47 through which the substrate cassettes 2 are superposed on each other and the frame 42b is formed on an upper or top surface thereof with a pin holding hole 48.

The frames 42a and 42b each include a leg 51 formed on a bottom surface thereof with a cassette positioning cutout 52. Such arrangement permits the substrate cassette 2 to be set at a predetermined position on a stage with increased accuracy and the substrates 80 received in the cassette to be arranged at equal intervals at high accuracy. The frames 42a and 42b may be made of a resin material or a rigid metal material, resulting in accuracy of the frames being increased.

The connection means comprises an end wall 60 for securely connecting one end of the side wall 41a and that of the side wall 41b to each other and a fixing rod 65 for securely connecting the other end of the side wall 41a and that of the side wall 41b to each other. The end wall 60 may comprise a flat plate of which an upper end is outwardly bent into an inverted U-like shape. The flat plate, as shown in FIG. 6, is formed with a plurality of through-holes 62 via which mounting screws are inserted.

The substrate cassette of the illustrated embodiment, as described above, is so constructed that the side rails 1 each including the partition plate 20 provided with the ribs 22 for spacing the substrates 80 from each other and the partition grooves 23 defined between the ribs 22 and the cover member 10 provided with the rib covers 12 for covering the ribs 22 and the groove covers 13 for covering the partition grooves 23 are mounted on the side walls 41a and 41b of the substrate cassette to close the windows 43a and 43b. Thus, manufacturing of the side rail 1 using a material exhibiting satisfactory workability permits a configuration of the whole substrate cassette and dimensions thereof to be stabilized, to thereby ensure access of the substrates to the substrate cassette being smoothly carried out. Also, it prevents deformation of the substrate cassette 2 and an dimensional error of the cassette even when it is large-sized.

Now, another embodiment of each of a side rail and a substrate cassette according to the present invention will be described hereinafter with reference to FIGS. 25 to 35.

Figure 25:
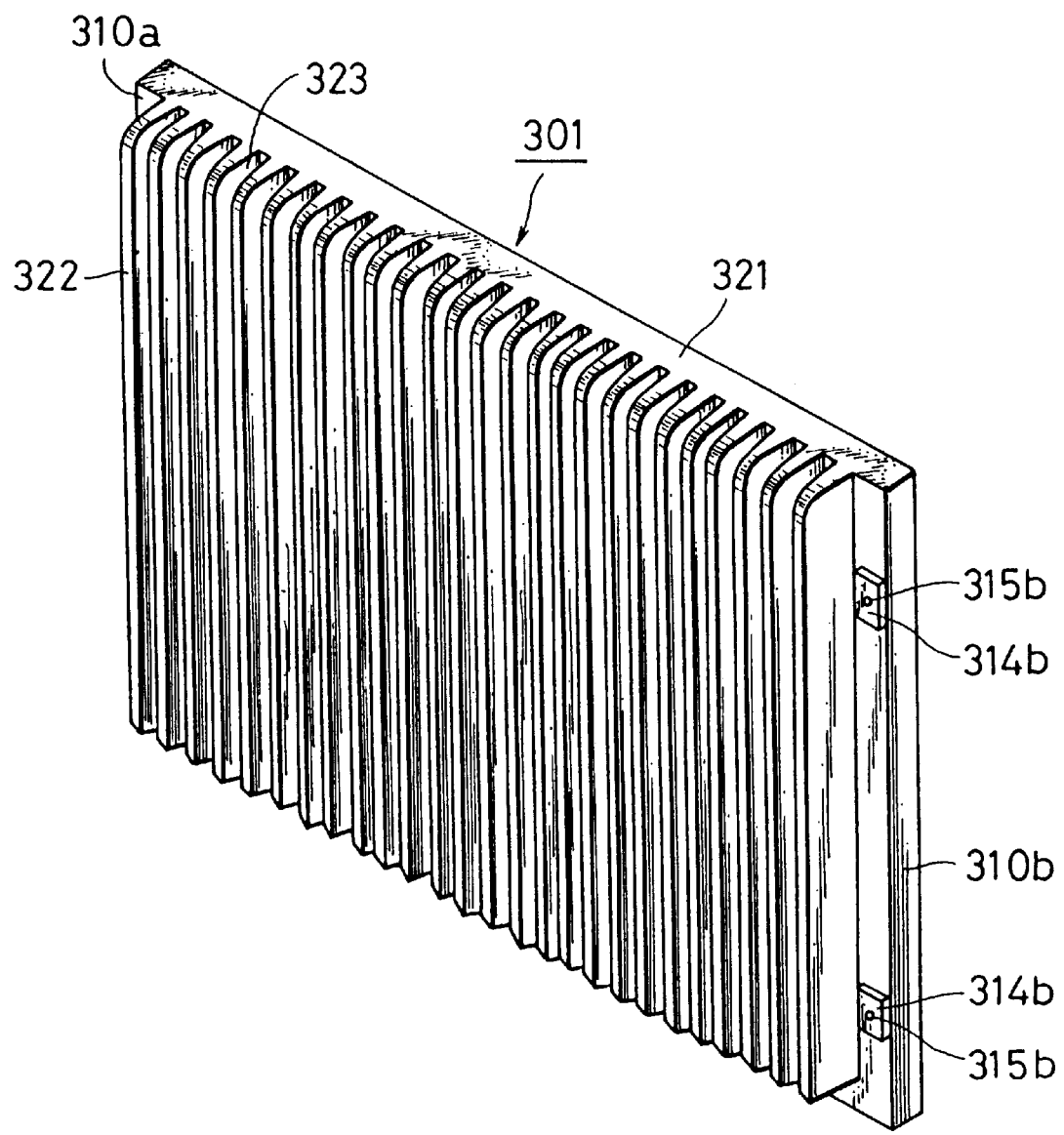
FIG. 25 is a perspective view showing a further embodiment of a side rail for a substrate cassette according to the present invention.

FIG. 25 shows a further embodiment of a side rail according to the present invention. A side rail of the illustrated embodiment generally designated at reference numeral 301 includes a cover member and a partition plate which are integrally formed of a resin material so as to exhibit satisfactory wearing properties and heat resistance. The side rail 301 thus constructed is mounted on a substrate cassette 302 shown in FIG. 28 to close each of side walls 341a and 341b of the substrate cassette 302.

The side rail 301 may be integrally formed of a resin material. For this purpose, it is preferable to use a resin material wherein polyether etherketone (PEEK) is alloyed in order to provide wearing properties, carbon fiber or the like is incorporated to reduce surface resistance to minimize charging of static electricity thereon, and resin exhibiting increased resistance to heat is further incorporated. The side rail formed of such a resin material can endure semiconductor treating steps such as, for example, insertion of a heated wafer, baking of a photoresist and the like which are carried out subsequent to diffusion, CVD and ion implantation.

The side rail 301 is provided on a side surface thereof with ribs 322 for spacing a plurality of substrates from each other and partition grooves 323 defined between the ribs 322 for receiving the substrates therein. The ribs 322 are formed on one surface of a flat plate section 321 so as to project therefrom and the partition grooves 323 are formed so as to be contiguous to the ribs 322.

Figure 26:
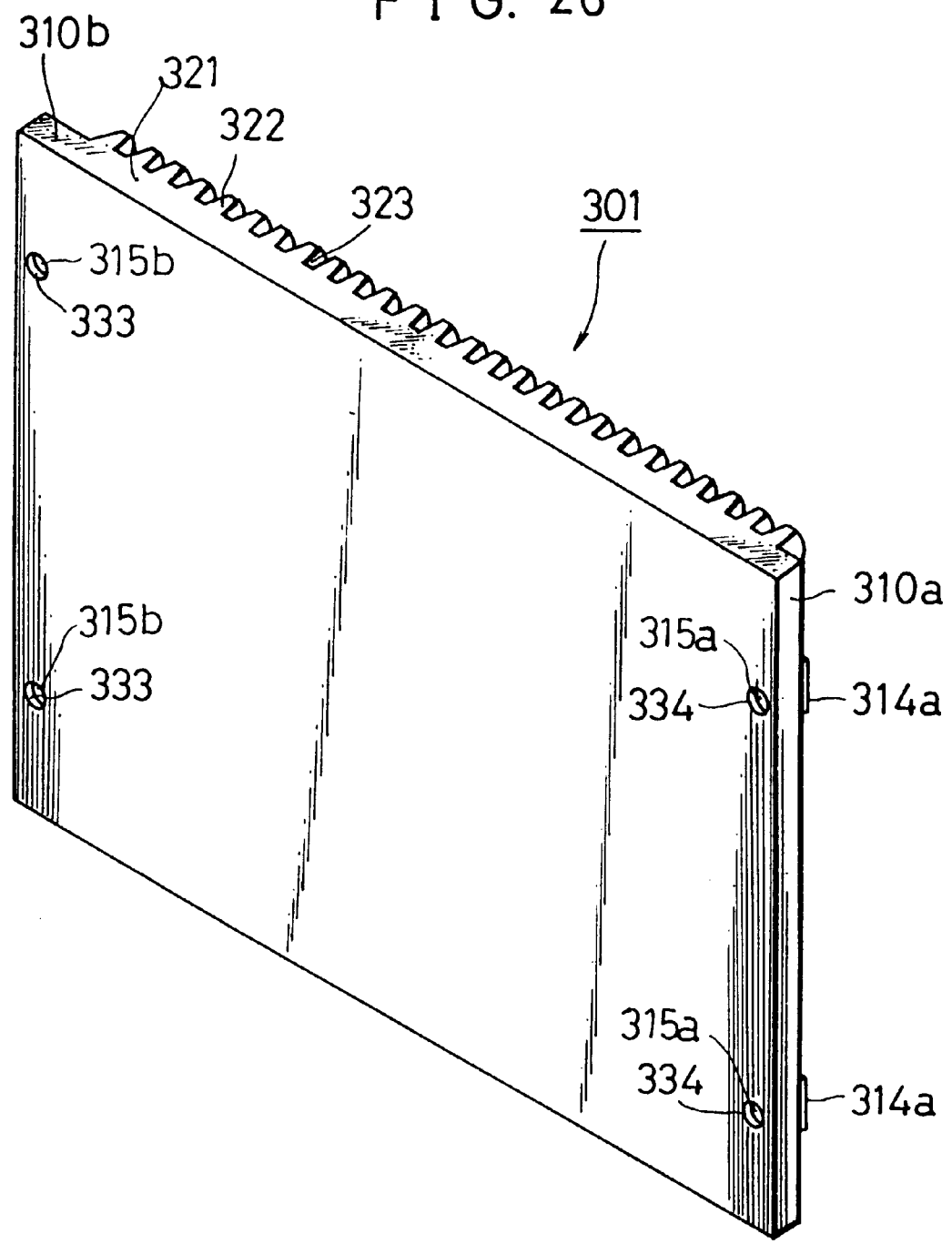
FIG. 26 is a perspective view showing a rear side of the side rail of FIG. 25.
Figure 27:
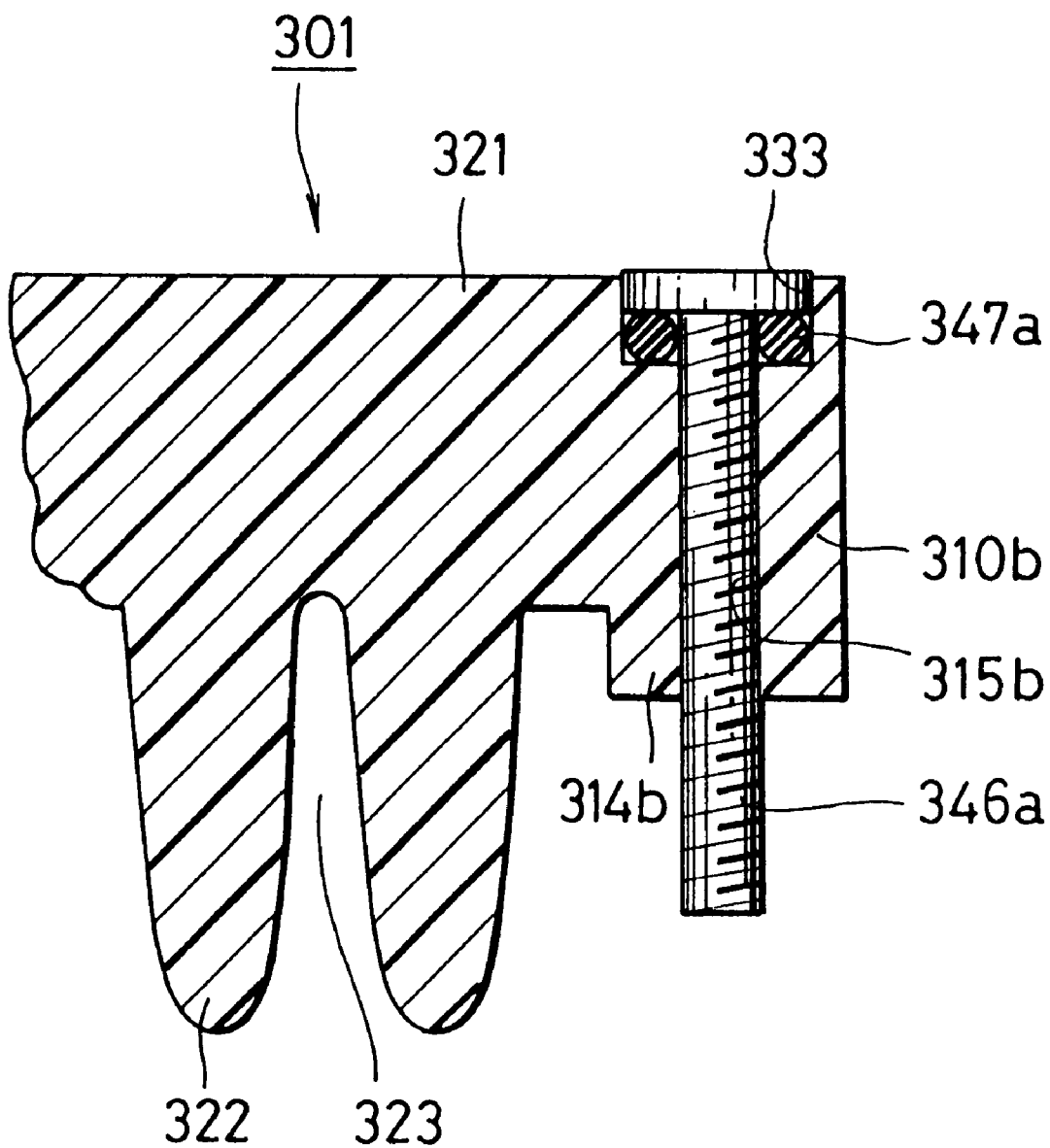
FIG. 27 is an enlarged schematic sectional view showing an essential part of the side rail shown in FIG. 25.

The side rail 301 is provided on both sides thereof with lugs 310a and 310b which are guided by guides 344a and 344b formed at the substrate cassette 302 for mounting of the side rail 301 on the substrate cassette 302 as described hereinafter. The lugs 310a and 310b, as shown in FIGS. 25 and 26, are formed at upper and lower portions thereof with mounting holes 315a and 315b through which mounting screws 346a and 346b (FIG. 30) are inserted, respectively, as well as recesses 333 and 334 which communicate with the mounting holes 315a and 315b and receive O-rings 347a and 347b (FIGS. 27 and 30) therein, respectively. Also, steps 314a and 314b are provided on the lugs 310a and 310b so as to surround the mounting holes 315a and 315b, respectively. The steps 314a and 314b function to form a small gap between the side rail 301 and each of the side walls of the substrate cassette 2 when the side rail 301 is mounted on the side wall of the substrate cassette 302 by means of the mounting screws 346a and 346b, to thereby prevent a whole surface of each of the lugs 310a and 310b of the side rail 301 from contacting with the side wall of the substrate cassette 302. Also, the steps 314a and 314b prevent formation of any gap between the side walls 341a and 341b and connection means 360 and 365 connected to each other by brazing in a vacuum atmosphere, to thereby facilitate removal of water during drying of the substrate cassette by spin dry and reduce time required for drying of the cassette by infrared rays.

Figure 28:
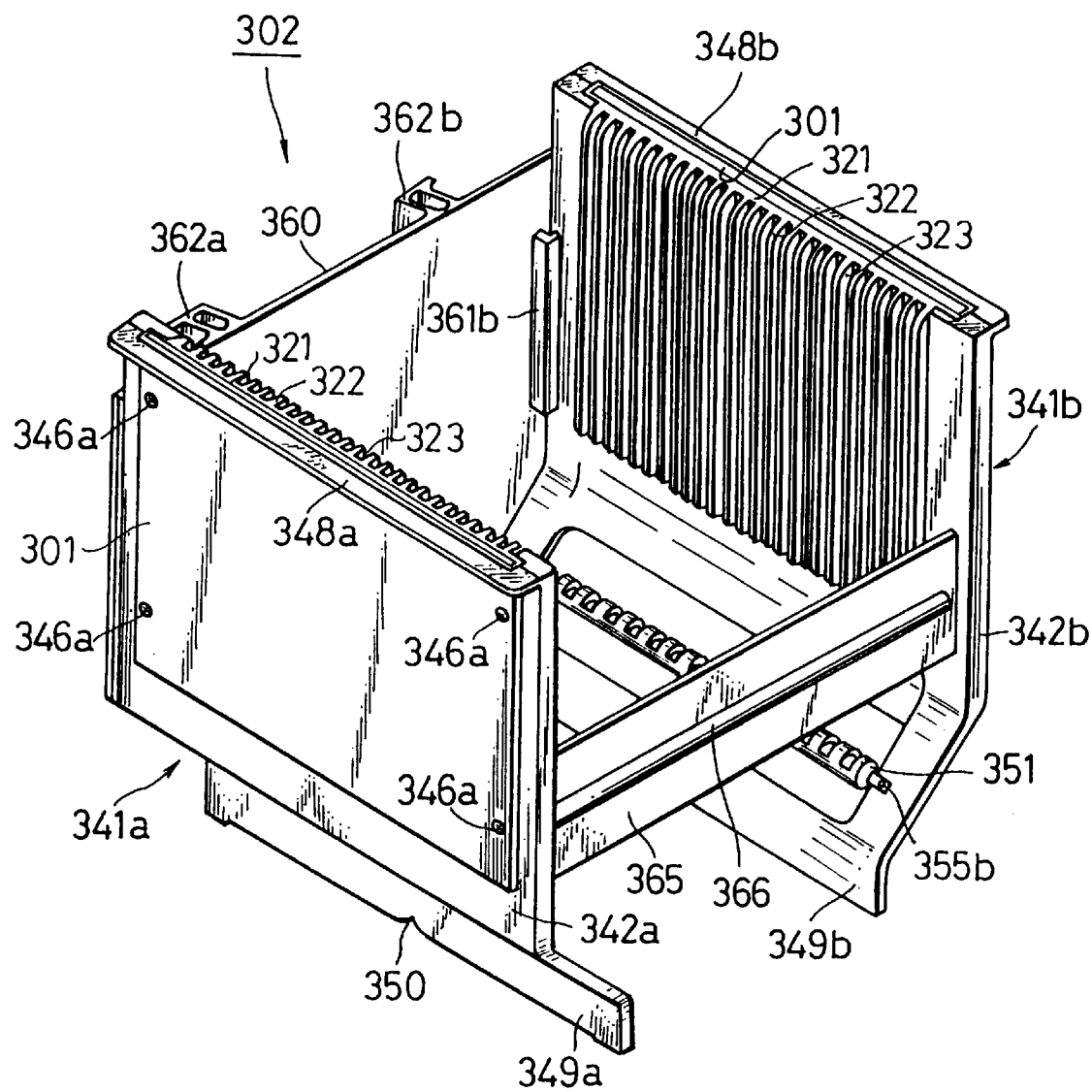
FIG. 28 is a perspective view showing another embodiment of a substrate cassette according to the present invention, in which the side rail shown in FIG. 25 is incorporated in each of side walls thereof.
Figure 29:
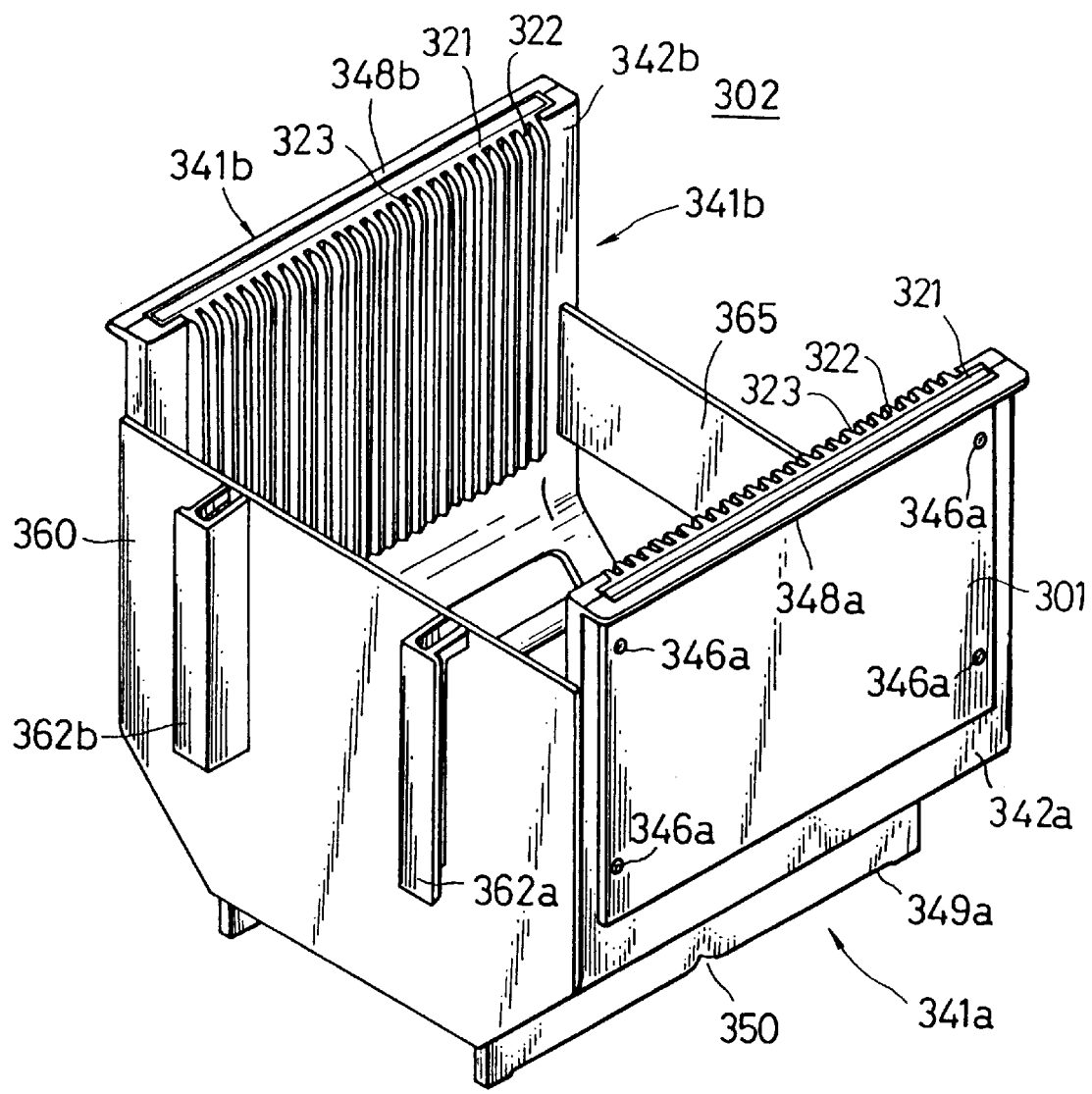
FIG. 29 is a perspective view of the substrate cassette shown in FIG. 28, which is viewed from an end wall thereof.
Figure 30:
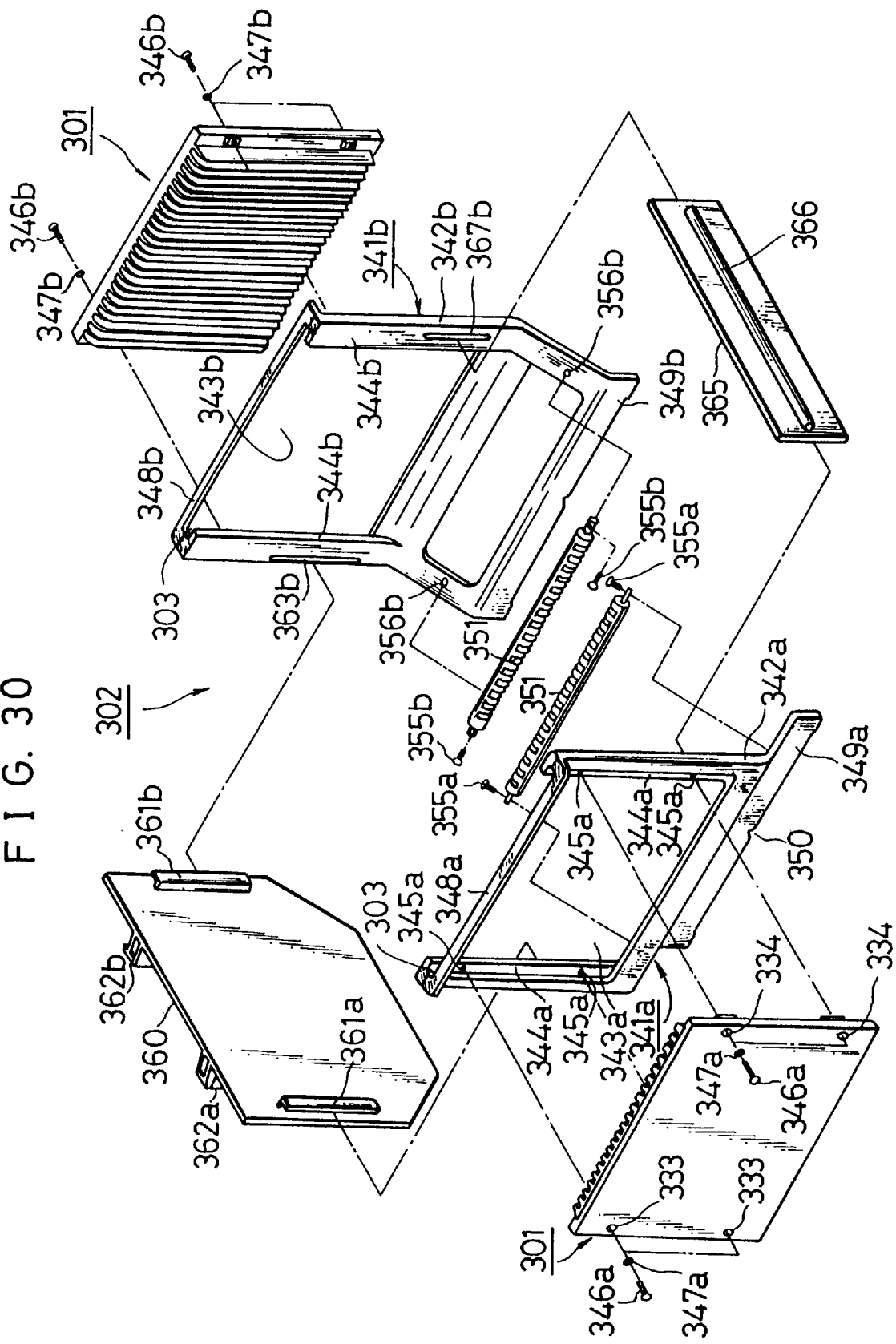
FIG. 30 is an exploded perspective view of the substrate cassette shown in FIG. 28.

FIG. 28 shows the substrate cassette 302 in which the side rails 301 each thus constructed are incorporated. The substrate cassette 302 includes the side walls 341a and 341b arranged opposite to each other and respectively formed with windows 343a and 343b and a connection means 360 and 365 such as an end surface and the like for connecting the side walls 341a and 341b to each other as in the embodiment described above. The windows 343a and 343b each are closed by the wide wall 301 as shown in FIGS. 28 to 30.

Figure 32:
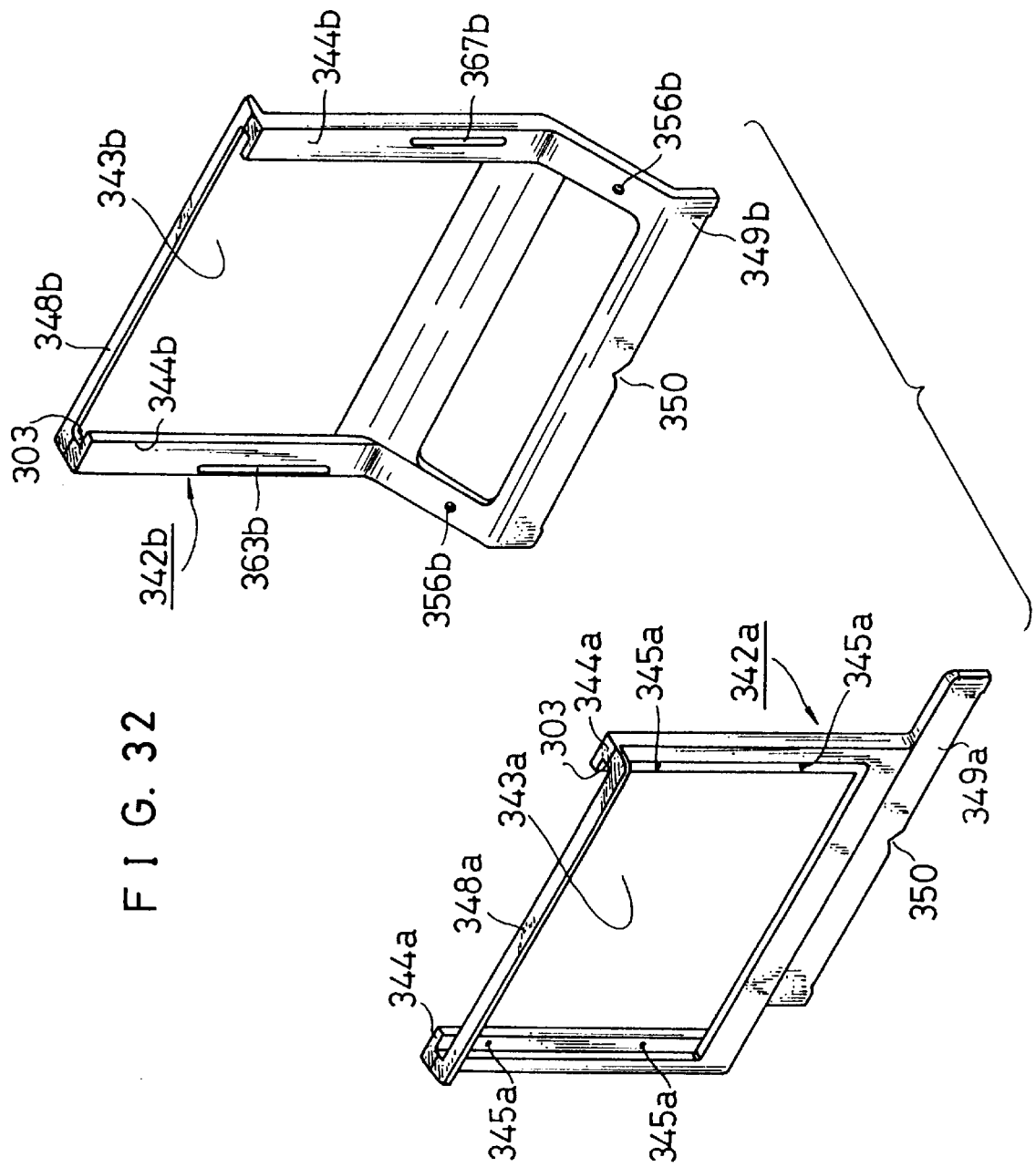
FIG. 32 is a perspective view showing a frame of the substrate cassette shown in FIG. 28.

The side walls 341a and 341b include frames 342a and 342b which are formed with the windows 343a and 343b and in which the side rails 301 are mounted, respectively. The frames 342a and 342b are formed on both sides of an inner surface thereof between which the windows 343a and 343b are defined with the guides 344a and 344b briefly described above in a manner to vertically extend, respectively. The guides 344a and 344b are formed with closed-end threaded holes 345a and 345b through which the side rails 301 are mounted in the windows 343a and 343b, respectively, as shown in FIGS. 30 and 32. The threaded screws 345b which are not shown in FIG. 32 are formed in a manner to positionally correspond to the threaded screws 345a.

Figure 31:
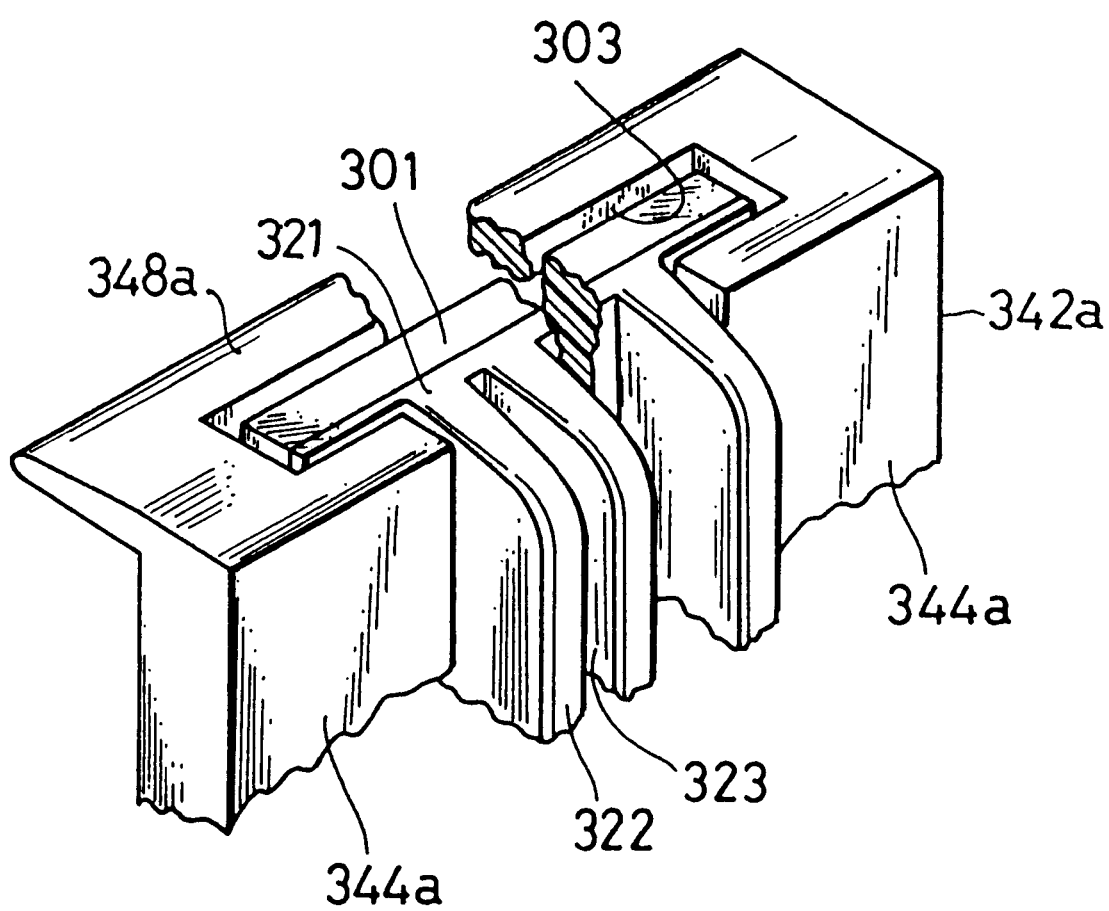
FIG. 31 is a fragmentary enlarged perspective view showing an essential part of a side-rail insertion opening formed at the substrate cassette shown in FIG. 28.

Mounting of each of the side rails 301 on each of the side walls 341a and 341b is carried out by inserting the side rail 301 from an upper opening 303 of each of the windows 343a and 343b along each of the guides 344a and 344b into each of the windows 343a and 343b as shown in FIG. 31 and inserting the mounting screws 346a and 346b through O-rings 347a and 347b into the recesses 333 and 334 of the side rail 301, followed by threaded fitting of the mounting screws 346a and 346b in the closed-end threaded holes 345a and 345b.

The frames 342a and 342b are provided on a tip surface thereof with flanges 348a and 348b which are adapted to be interposedly held by a holding means (not shown) of a substrate cleaning equipment. Also, the frames 342a and 342b are somewhat inwardly bent at a section thereof below the windows 343a and 343b and the inwardly bent sections of the frames 342a and 343b are threadedly formed at an intermediate portion thereof with closed-end mounting holes 356a and 356b in which stoppers 351 for holding substrates received in the substrate cassette 302 at a predetermined position are threadedly fitted, as shown in FIGS. 30 and 32. The mounting holes 356a which are not shown in the drawings are arranged so as to positionally correspond to the mounting holes 356b. The frames 342a and 342b are provided on a bottom thereof with legs 349a and 349b, which are arranged so as to extend in a direction perpendicular to the guides 344a and 344b and formed on a bottom surface thereof with cassette positioning cutouts 350, respectively.

The frames 342a and 342b thus constructed may be readily formed by cutting a continuous material formed by extrusion molding into a predetermined length. Formation of the frames 342a and 342b using aluminum permits the substrate cassette to be formed with increased accuracy and decreased in weight.

Figure 33:
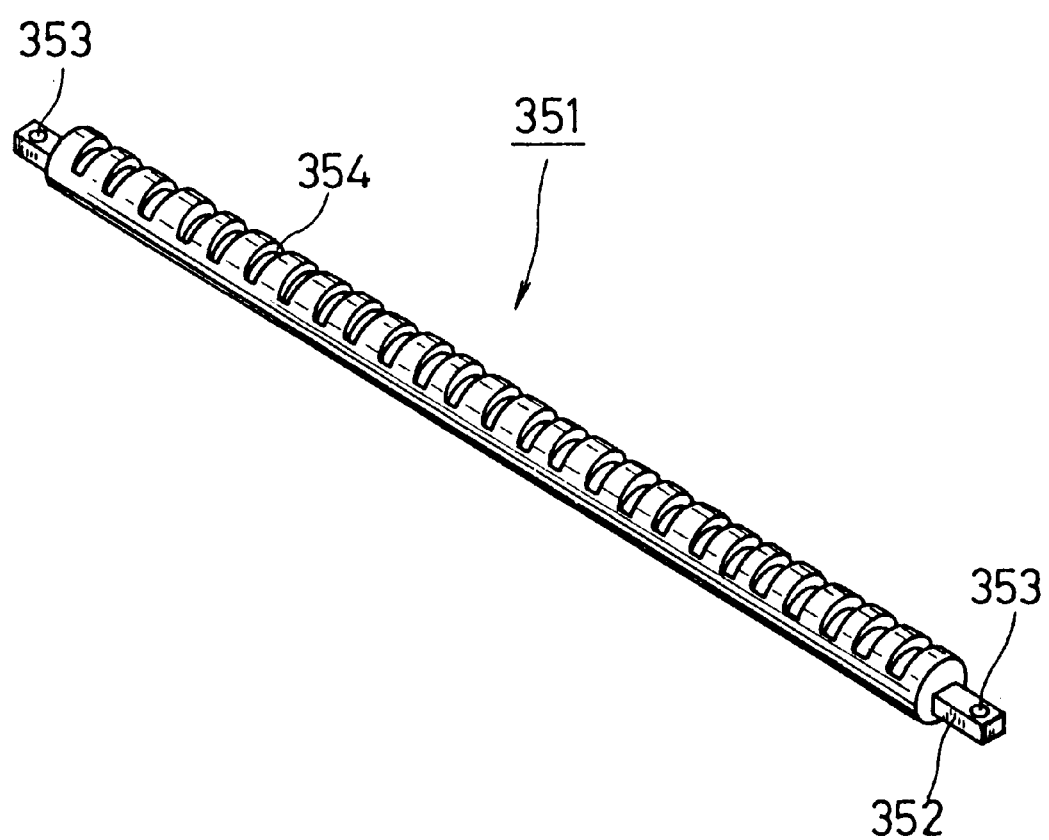
FIG. 33 is a perspective view showing a stopper of the substrate cassette shown in FIG. 28.

The stoppers 351, as shown in FIG. 33, each include a rod-like member made of a resin material and provided with a plurality of cutouts 354 for receiving the substrates at equal intervals therein and a core member 352 formed at both ends thereof with through-holes 353. The stoppers 351 are mounted in the mounting holes 356a and 356b by inserting mounting screws 355a and 355b via the through-holes 353.

The connection means comprises an end wall 360 for securely connecting one ends of the side walls 341a and 341b oppositely arranged opposite to each other and a fixing plate 365 for securely connecting the other ends of the side walls 341a and 341b to each other. The end wall 360 and fixing plate 365 may be readily provided by cutting a continuous material formed by extrusion molding into a predetermined length as in the frames 342a and 342b.

Figure 34A:
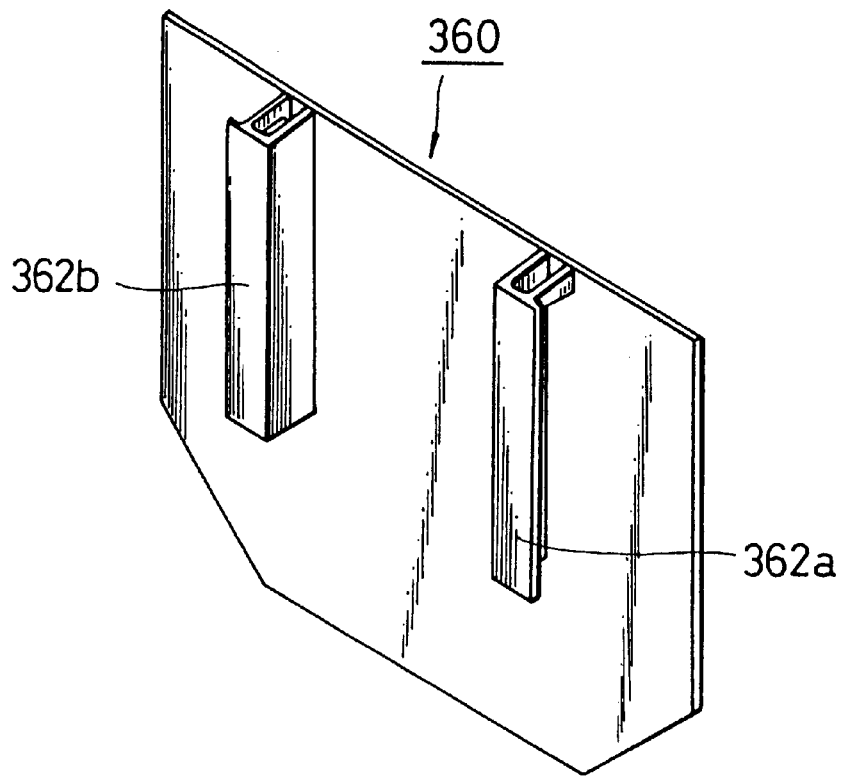
FIGS. 34(A) and 34(B) each are a perspective view showing an end wall of the substrate cassette shown in FIG. 28.
Figure 34B:
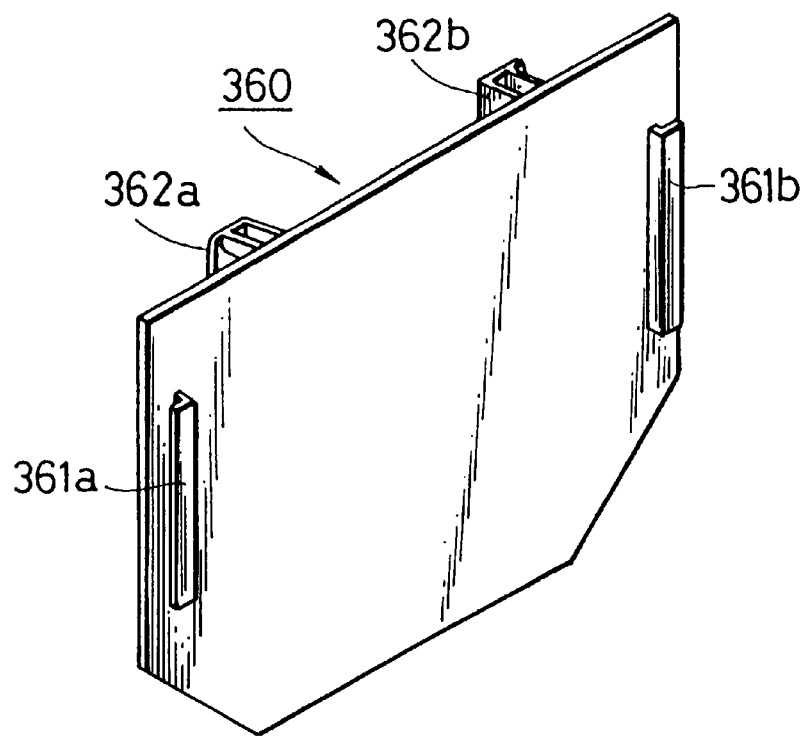

The end wall 360 is formed on an inner surface thereof with projections 361a and 361b of a substantially L-shape in section for fixing the side walls 341a and 341b and on an outer surface thereof with grips 362a and 362b gripped by hands of a working robot, as shown in FIGS. 28, 29 and 34.

The fixing plate 365 is provided on a central portion of an outer surface thereof with a positioning projection 366 of an elongate shape as shown in FIGS. 28, 30 and 35.

In order to render connection between the frames 342a, 342b and the connection means 360, 365 firm, the frames 342a and 342b are formed on an inner surface thereof with first recesses 363a and 363b in which the projections 361a and 361b of the end wall 360 are fitted at a distal end thereof and second recesses 367a and 367b in which the fixing plate 365 are fitted at both ends thereof, as shown in FIGS. 30 and 32. The first and second recesses 363a and 367a which are not shown in the drawings are arranged in a manner to positionally correspond to the first and second recesses 363b and 367b, respectively.

Manufacturing of the substrate cassette 302 of the illustrated embodiment merely requires three molds for the frames 342a and 342b, end wall 360, and fixing plate 365. The projections 361a and 361b of the end wall 360 are fitted in the first recesses 363a and 363b of the side walls 341a and 341b and the fixing plate 365 is fitted at both ends thereof in the second recesses 367a and 367b of the side walls 341a and 341b, respectively, followed by brazing of connection sections therebetween in a vacuum atmosphere, resulting in the side walls 341a and 341b being fixedly connected to the connection means 360 and 365. Such vacuum brazing between the side walls 341a, 341b and the connection means 360, 365 prevents formation of any gap at the connection sections therebetween, so that the substrate cassette may be washed with deionized water free of any ions by means of an automatic cassette washing unit without being disassembled.

As can be seen from the foregoing, the side rail for the substrate cassette according to the present invention includes the partition plate provided with the ribs for spacing the substrates from each other and the partition grooves defined between the ribs and the cover member provided with the rib covers for covering the ribs and the groove covers for covering the partition grooves. Thus, the present invention permits static electricity charged on a side of the base section of the cover member to be discharged to the partition plate, to thereby prevent the static electricity from adversely affecting peripheral equipments. Also, such construction of the present invention permits warpage which possibly occurs in the cover member to be forcibly rectified by the partition plate, resulting in the substrates being received in the substrate cassette with high accuracy.

Also, the side rail of the present invention constructed in the form of the cover unit including the rib covers for covering the ribs and the groove covers for covering the partition grooves each defined between each adjacent two of the ribs. Thus, selection of a suitable material for the cover unit reduces production of particles due to contact of the cover unit with the substrates and prevents pollution of the substrates with heavy metal. In addition, the present invention permits only the cover unit to be made of a resin material, so that generation of outer gas is minimized, to thereby substantially restrain the substrates from being adversely affected by the outer gas.

Further, the substrate cassette of the present invention is so constructed that the side rails each including the partition plate provided with the ribs for spacing the substrates from each other and the partition grooves defined between the ribs and the cover member provided with the rib covers for covering the ribs and the groove covers for covering the partition grooves are mounted on the side walls of the cassette to close the windows of the cassette. Thus, manufacturing of the side rail using a material exhibiting satisfactory workability permits a configuration of the whole substrate cassette and dimensions thereof to be stabilized, to thereby ensure that satisfactory access of the substrates to the substrate cassette is smoothly carried out. Also, it prevents deformation of the substrate cassette and an dimensional error of the cassette even when it is large-sized.

Moreover, in the present invention, the lugs of the side rail are formed with the mounting holes. Also, the lugs are formed with the O-ring receiving recesses in a manner to be contiguous to the mounting holes. Thus, the O-rings received in the recesses when the side rails are mounted on the side walls of the substrate cassette prevent formation of any gap between the side rails and the mounting screws, to thereby prevent water from entering the mounting holes through which the mounting screws are inserted, resulting in washing of the substrate cassette with deionized water being possible without requiring disassembling of the cassette.

Furthermore, the present invention is so constructed that the steps provided on the lugs of each of the side rails function to form a small gap between the side rail and each of the side walls of the substrate cassette when the side rail is mounted on the wide wall of the substrate cassette by means of the mounting screws, to thereby prevent a whole surface of each of the lugs of the side rail from contacting with the side wall of the substrate cassette. Also, the steps prevent formation of any gap between the side walls and connection means connected to each other by brazing in a vacuum atmosphere, to thereby facilitate removal of water during drying of the cassette by spin dry and reduce time required for drying of the cassette by infrared rays.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A substrate cassette comprising:

side walls arranged opposite to each other and each including a window;

a connection means for connecting said side walls to each other; and a side rail for closing said window of each of said side walls;

wherein said side rail comprises:

a partition plate formed on a surface thereof with ribs for receiving a plurality of substrates therein in a manner to space them from each other, said ribs being arranged so as to define partition grooves therebetween; and a cover member arranged for covering said partition plate and including rib covers for covering said ribs and groove covers arranged between said rib covers for covering said partition grooves, the substrate cassette is formed by the side walls, connection means and side rails into a rectangular configuration having an open top and an open bottom;

each side rail is detachably mounted on a corresponding one of the side walls; and the cover member is detachably mounted on the partition plate.

2. A substrate cassette as defined in claim 1, wherein said side walls each include a frame including said window in which said side rail is mounted.

3. A substrate cassette as defined in claim 2, wherein said frame includes a leg formed on a bottom surface thereof with a cassette positioning cutout.

4. A substrate cassette as defined in claim 2, wherein said frame includes a leg formed on a bottom surface thereof with a cassette positioning cutout.

5. A substrate cassette as defined in claim 1, wherein said frame is formed of one of a resin material and a rigid metal material.

6. A substrate cassette as defined in claim 2, wherein said frame is formed of one of a resin material and a rigid metal material.

7. A substrate cassette as defined in claim 3, wherein said frame is formed of one of a resin material and a rigid metal material.

8. A substrate cassette as defined in claim 4, wherein said frame is formed of one of a resin material and a rigid metal material.

9. A substrate cassette comprising:

side walls arranged opposite to each other and each including a window;

a connection means for connecting said side walls to each other; and a side rail for closing said window of each of said side walls;

wherein said side rail comprises:

a partition plate provided on a surface thereof with ribs for receiving a plurality of substrates therein in a manner to space them from each other, said ribs being arranged so as to define partition grooves therebetween; and a cover member arranged for covering said partition plate and including rib covers for covering said ribs and groove covers arranged between said rib covers for covering said partition grooves, said rib covers and groove covers being integrally formed of a resin material, the substrate cassette is formed by the side walls, connection means and side rails in association with each other into a rectangular configuration having an open top side and an open bottom side;

each side rail is detachable mounted on a corresponding one of the side walls; and the cover member is detachably mounted on the partition plate.

10. A substrate cassette comprising:

side walls arranged opposite to each other and each including a window;

a connection means for connecting said side walls to each other, the connection means and each of the side walls are joined to each other so as to render each connection section therebetween free of any gap; and a side rail for closing said window of each of said side walls;

said side walls each including a frame including said window in which said side rail is mounted, said frame being formed, on portions of an inside thereof positioned on both sides of said window, with vertically extending guides for guiding the mounting of said side rail in said window;

said side rail including a flat plate section provided on a surface thereof with ribs for receiving a plurality of substrates therein in a manner to space them from each other;

said ribs being arranged so as to define partition grooves therebetween and formed on said surface of said flat plate section so as to project therefrom and said partition grooves being arranged so as to be contiguous to said ribs;

said flat plate section being provided on both sides thereof with lugs guided by said guides of said frame, the substrate cassette is formed by the side walls, connection means and side rails in association with each other into a rectangular configuration having top and bottom sides opened; and each side rail is detachably mounted on a corresponding one of the side walls, wherein said lugs are each provided on an inner side surface thereof with a step for contacting a respective one of said vertically extending guides in a manner to be projected from said inner side surface, said step being adapted to come into contact with said guide to define an offset space between the remaining portion of said inner side surface of the lug and said guide, to thereby form a gap between said side rail and said side wall when said side rail is mounted on said side wall to facilitate removal of a liquid.

11. A substrate cassette comprising:

side walls arranged opposite to each other and each including a window;

a connection means for connecting said side walls to each other,;

a side rail for closing said window of each of said side walls, the connection means and each of the side walls are joined to each other so as to render each connection section therebetween free of any gap;

said side walls each including a frame including said window in which said side rail is mounted, said frame being formed on portions of an inside thereof positioned on both sides of said window, with vertically extending guides for guiding the mounting of said side rail in said window;

said side rail including a flat plate section provided on a surface thereof with ribs for receiving a plurality of substrates therein in a manner to space them from each other;

said ribs being arranged so as to define partition grooves therebetween and formed on said surface of said flat plate section so as to project therefrom and said partition grooves being arranged so as to be contiguous to said ribs;

said flat plate section being provided on both sides thereof with lugs guided by said guides of said frame, the substrate cassette is formed by the side walls, connection means and side rails in association with each other into a rectangular configuration having top and bottom sides opened; and each side rail is detachably mounted on a corresponding one of the side walls, wherein said lugs are each provided on an inner side surface thereof with a step for contacting a respective one of said vertically extending guides in a manner to be projected from said inner side surface, said step being adapted to come into contact with said guide to define an offset space between the remaining portion of said inner side surface of the lug and said guide, to thereby form a gap between said side rail and said side wall when said side rail is mounted on said side wall to facilitate removal of a liquid.

12. A substrate cassette as defined in claim 10, wherein said guides each are formed with a closed-end threaded hole into which a screw for mounting said side rail thereto is screwed.

13. A substrate cassette as defined in claim 11, wherein said frame is formed on a top surface thereof with a flange inwardly bent at a section thereof below said window, said frame is formed at an intermediate portion of said inwardly bent section thereof with a closed-end mounting hole;

said frame has a bottom portion formed in parallel with a direction in which said guides extend; and said frame is provided on a bottom surface thereof with a leg formed with a cassette positioning cutout.

14. A substrate cassette as defined in claim 11, wherein said connection means includes an end wall for securely connecting one end of said opposite side walls to each other and a fixing plate for securely connecting the other end of said side walls to each other;

said end wall being formed on an inner surface thereof with projections of a substantially L-shape in section for connection of said side walls and on an outer surface thereof with grips.

15. A substrate cassette as defined in claim 14, wherein said frame is formed on an inner surface thereof with a first recess in which one of said projections of said end wall is fitted and a second recess in which said fixing plate is fitted at one end thereof.

16. A substrate cassette as defined in claim 14, wherein said frame, end wall and fixing plate are formed by cutting a continuous material formed of aluminum by extrusion molding into a predetermined length.

17. A substrate cassette as defined in claim 9, wherein said side walls each include a frame including said window in which said side rail is mounted.

18. A substrate cassette as defined in claim 9, wherein said frame includes a leg formed on a bottom surface thereof with a cassette positioning cutout.

19. A substrate cassette as defined in claim 9, wherein said frame is formed of a resin material or a rigid metal material.

20. The substrate cassette of claim 1, wherein said side walls include a lower portion, below the window, and inclined inwardly.

21. The substrate cassette of claim 20, wherein the lower portion includes a cutout aperture.

22. The substrate cassette of claim 21 further including a stopper member provided with a plurality of cutouts for receiving substrates and positioned to extend across the cutout aperture in said lower portion.

23. The substrate cassette of claim 22, wherein the stopper member is in a rod-like configuration and is formed of a resin material.

24. The substrate cassette of claim 22 further including an end wall with substantially L-shaped projections, said side walls having complementary recesses to receive the L-shaped projections.

25. A substrate cassette comprising:

first and second side frames, each having an aperture;

a pair of side rail members, each respectively detachably mounted in a corresponding side frame aperture and configured to support and separate a plurality of substrates;

an end wall mounted respectively to one side of the first and second side frames and substantially closing one end of the cassette; and a fixing member, smaller than the end wall, mounted respectively to the other side of the first and second side flames to complete a perimeter of the cassette and to partially close the other end of the cassette, whereby a top and a bottom of the cassette is open, a respective connection section between the end wall and each of the first and second side frames and a respective connection section between the fixing member and each of the first and second side frames are rendered free of any gap.

26. A substrate cassette as defined in claim 25 further including a stopper member mounted on each side frame below the aperture to contact and support a substrate.

27. A substrate cassette as defined in claim 25, wherein each side rail member flirter includes a unitary cover member that covers an entire interior side of the side rail member.

28. A substrate cassette as defined in claim 27, wherein the first and second side frames are formed of aluminum and the unitary cover member is formed of a resin material.

29. A substrate cassette as defined in claim 28, wherein the resin material is a selected from one of a tetrafluoroethylene-perfluoroethylene alkylvinyl ether copolymer and a polyether etherketone.

30. A substrate cassette as defined in claim 25, wherein the end wall member includes a pair of L-shaped connectors for respectively engaging each side frame.

31. A substrate cassette as defined in claim 25, wherein each side frame has a bottom edge with a cassette positioning cutout.

32. A substrate cassette as defined in claim 25, wherein each side rail member includes a stepped lug for mounting on a guide member of a side frame.

33. A substrate cassette as defined in claim 10 further including a mounting hole in the side wall and the step surrounds the mounting hole.

34. A substrate cassette as defined in claim 25, wherein the fixing member is a plate formed on an outer surface thereof with a positioning projection of an elongated shape.

35. A substrate cassette as defined in claim 11, wherein said lugs are each formed with a mounting hole through which a mounting screw is inserted and said step surrounds said mounting hole.

36. A substrate cassette as defined in claim 35, wherein said lugs are each provided with a recess formed on an outer side surface thereof to communicate with said mounting hole so as to receive an O-ring therein.

37. A substrate cassette as defined in claim 36, wherein said guides are each formed with a closed-end threaded hole into which said mounting screw is screwed.

* * * * *